United States Patent
Ogawa et al.

(10) Patent No.: US 8,440,518 B2
(45) Date of Patent: May 14, 2013

(54) METHOD FOR MANUFACTURING A PATTERN FORMED BODY, METHOD FOR MANUFACTURING A FUNCTIONAL ELEMENT, AND METHOD FOR MANUFACTURING A SEMICONDUCTOR ELEMENT

(75) Inventors: Kenichi Ogawa, Tokyo-to (JP); Tomomi Suzuki, Chiba-ken (JP); Masataka Kano, Saga-ken (JP)

(73) Assignee: Dai Nippon Printing Co., Ltd., Tokyo-to (JP)

( * ) Notice: Subject to any disclaimer, the term of this patent is extended or adjusted under 35 U.S.C. 154(b) by 3 days.

(21) Appl. No.: 13/071,715

(22) Filed: Mar. 25, 2011

(65) Prior Publication Data

US 2011/0244639 A1    Oct. 6, 2011

(30) Foreign Application Priority Data

Mar. 31, 2010   (JP) ................................ 2010-082957

(51) Int. Cl.
*H01L 21/336* (2006.01)

(52) U.S. Cl.
USPC ............... 438/197; 438/38; 438/71; 438/260; 438/684; 506/32; 430/309; 430/325; 427/256; 427/258; 257/E21.409

(58) Field of Classification Search ........................ None
See application file for complete search history.

(56) References Cited

U.S. PATENT DOCUMENTS

| | | | |
|---|---|---|---|
| 7,138,217 B2 * | 11/2006 | Aoai et al. ................. | 430/270.1 |
| 2005/0003110 A1 | 1/2005 | Tanaka et al. | |
| 2005/0042866 A1 * | 2/2005 | Klapproth et al. ............ | 438/684 |
| 2007/0072093 A1 * | 3/2007 | Sawada et al. .................... | 430/5 |
| 2007/0215273 A1 * | 9/2007 | Jacobs .......................... | 156/297 |
| 2010/0028804 A1 | 2/2010 | Iwato et al. | |
| 2010/0314611 A1 | 12/2010 | Murata et al. | |

FOREIGN PATENT DOCUMENTS

| | | |
|---|---|---|
| JP | 2003-071261 A | 3/2003 |
| JP | 2003-518756 A | 6/2003 |
| JP | 2004-288469 A | 10/2004 |
| JP | 2006-057167 A | 3/2006 |
| JP | 2006-278534 A | 10/2006 |
| JP | 2008-009321 A | 1/2008 |
| JP | 2008-130920 A | 6/2008 |
| JP | 2008-171978 A | 7/2008 |
| JP | 2010-61116 A | 3/2010 |
| WO | 01/47045 A1 | 6/2001 |
| WO | 03/069400 A1 | 8/2003 |
| WO | 2009/044659 A1 | 4/2009 |

* cited by examiner

*Primary Examiner* — Julio J Maldonado
*Assistant Examiner* — Yasser Abdelaziez
(74) *Attorney, Agent, or Firm* — Ladas & Parry LLP

(57) ABSTRACT

A manufacturing method of a semiconductor element from a pattern formed body capable of attaining patterning efficiently with a high precision. The method includes a photoresist pattern formation step, a hydrophilicity imparting step and a photoresist pattern peeling step.

4 Claims, 8 Drawing Sheets

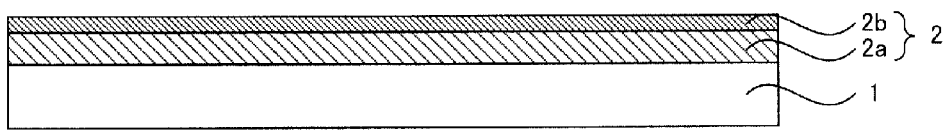
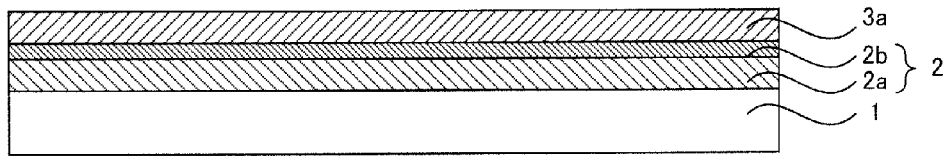
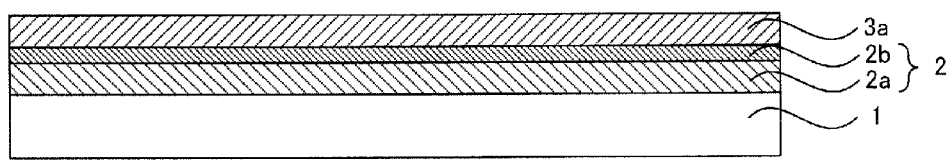
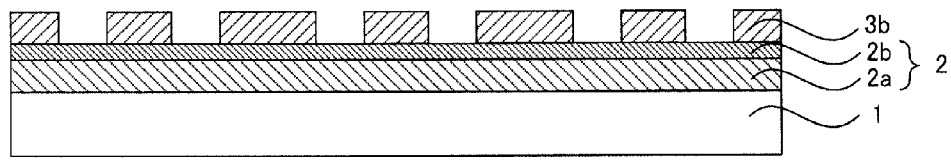
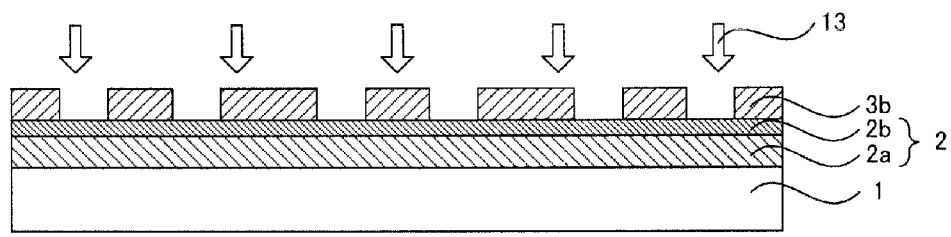
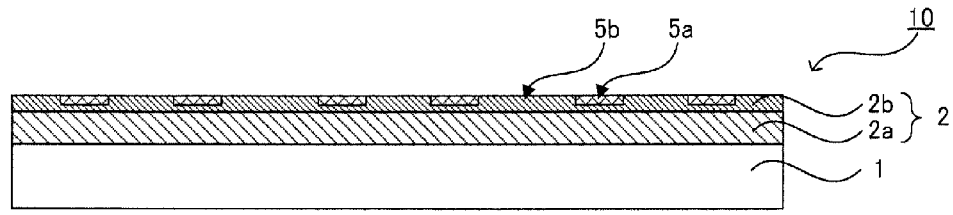

METHOD FOR MANUFACTURING A PATTERN FORMED BODY, METHOD FOR MANUFACTURING A FUNCTIONAL ELEMENT, AND METHOD FOR MANUFACTURING A SEMICONDUCTOR ELEMENT

BACKGROUND OF THE INVENTION

1. Field of the Invention

The present invention relates to a manufacturing method of a pattern formed body which is suitably used to produce a semiconductor element such as a transistor or a diode.

2. Description of Related Art

Conventionally, as a manufacturing method of a pattern formed body capable of forming various patterns such as a design, an image, characters and a circuit, various methods have been suggested.

In particular, as a manufacturing method of a pattern formed body capable of forming, a highly precise pattern, suggested is a method of forming a pattern having a surface of different wettability to a liquid.

Suggested is, for example, a method of forming a transparent electroconductive film into a pattern form on a substrate, forming an insulation film in openings of the transparent electroconductive film by using a material having a variable surface-wettability onto a liquid thin-film material, the wettability being varied by irradiation with light, increasing the wettability of the light-irradiated areas of the surface of the insulation film onto the liquid thin-film material by irradiating the transparent electroconductive film and the insulation film partially and selectively with the light through a photomask, and giving the liquid thin-film material onto the light-irradiated areas of the transparent electroconductive film and the insulation film, thereby forming a thin film into a pattern form (see Japanese Patent Application Laid-Open (JP-A) No. 2004-288469). According to this method, by the irradiation of the insulation film with the light, areas having different wettabilities onto the liquid thin-film material are formed as the film surface, and this wettability difference of the film surface is used to make it possible to form a thin film into a pattern form with a high precision.

Suggested is also a method of causing a substrate on which a liquid repellent layer is formed on a base material and a photomask to adhere closely to each other under a predetermined pressure, radiating light through the photomask onto the substrate to form, forming in the liquid repellent layer, a pre-pattern having different contact angles onto a functional liquid, and supplying the functional liquid onto the pre-pattern to form a minute structure in the part where the contact angle onto the functional liquid is small (see JP-A No. 2008-9321).

Furthermore, suggested is a method of forming a polyimide layer exhibiting hydrophobicity onto a glass substrate exhibiting hydrophilicity, forming a photoresist onto the polyimide layer, patterning the polyimide layer by photolithography to form hydrophilic areas where the glass substrate is uncovered, and hydrophobic areas where the polyimide layer is formed on the glass substrate, and causing an electroconductive material or semiconductor material to adhere onto the hydrophilic areas by ink-jet printing, thereby forming source/drain electrodes (see Japanese Patent Application National Publication (Laid-Open) No. 2003-518756). According to this method, after the patterning of the photoresist in the photolithography, the workpiece is exposed to oxygen plasma, so as to etch the polyimide layer and further make the hydrophilicity of the glass substrate surface high.

[Patent Document 1] JP-A No. 2004-288469
[Patent Document 2] JP-A No. 2008-009321
[Patent Document 3] JP-A No. 2003-518756

In the method described in JP-A No. 2004-288469, in the case of causing the substrate and the photomask to adhere closely to each other at the time of the light irradiation, the highest precision can be obtained; however, the close adhesion causes the photomask to be damaged or polluted. Thus, it is stated that the gap between the substrate and the photomask is preferably made as small as possible. It is also stated that the wettability change caused by the light irradiation depends largely on an effect based on reaction between an oxygen active species near the insulation film and the insulation film surface, and thus the light having wavelengths in the vacuum-ultraviolet wavelength range is preferable.

However, if a space is present between the substrate and the photomask, the following problem is caused: when the workpiece is irradiated with vacuum-ultraviolet ray, the oxygen active species goes around also to the areas not irradiated with the light-ultraviolet light so that an obscure pattern, which is low in precision, is formed. Furthermore, in a case where the resultant pattern formed body is used to manufacture a functional element by forming a thin film on the areas irradiated with the vacuum-ultraviolet ray and subsequently further forming a member on the areas not irradiated therewith (i.e., non-irradiated areas), the following fears arise: when the oxygen active species goes around to the non-irradiated areas during the irradiation with the vacuum-ultraviolet ray, the surface of the non-irradiated area is oxidized with the oxygen active species so that OH groups are formed on the non-irradiated area surface to cause carrier trapping, and additionally the interface between the non-irradiated areas and the member formed thereon turns rough; these matters result in a deterioration in the flatness or the molecular orientation of the laminated molecules so that characteristics of the element are declined.

According to the method described in JP-A No. 2008-9321, the substrate and the photomask adhere closely to each other to have a measure of pressure onto each other, therefore, it scarcely happens that the oxygen active species goes around to the non-irradiated areas by the light. As a result, the boundaries between the liquid repellent areas, which are the irradiated areas, and the lyophilic areas, which are the non-irradiated areas, can be made clear.

However, the method has a problem that the photomask is damaged or polluted as described above since the substrate and the photomask are caused to adhere closely to each other. The method also has a problem that the irradiated areas are not surface-modified or that much time is required to attain the surface modification since the amount of oxygen atom radicals generated by the light is small.

The method described in Japanese Patent Application National Publication (Laid-Open) No. 2003-518756 has a problem that steps based on the polyimide layer are generated so that a method for applying an ink onto the hydrophilic areas is restricted, and a problem that an ink cannot be applied onto a target pattern in accordance with the kind of the pattern.

SUMMARY OF THE INVENTION

In light of the above-mentioned problems, the invention has been made. A main object of the invention is to provide a manufacturing method of the pattern formed body making it possible to attain patterning efficiently with a high precision. Another object of the invention is to provide a manufacturing method of the pattern formed body making it possible that when a pattern formed body is used to manufacture a functional element, characteristics of the element are improved.

In order to achieve the objects, the invention provides a method for manufacturing a pattern formed body, comprising: a photoresist pattern formation step of forming a photoresist pattern on a hydrophobic layer formed on a substrate and having a surface exhibiting hydrophobicity; a hydrophilicity imparting step of radiating an energy onto the surface of the hydrophobic layer on which the photoresist pattern is formed, thereby making the surface hydrophilic to form a hydrophilic area; and a photoresist pattern peeling step of peeling the photoresist pattern and forming a hydrophilic/hydrophobic pattern on the hydrophobic layer surface, in which the hydrophilic area and a hydrophobic area covered previously with the photoresist pattern in hydrophilicity imparting step are formed in a pattern form.

According to the invention, in the hydrophilicity imparting step, areas other than the area to be made hydrophilic (hydrophilic area) are covered with the photoresist pattern so as to be protected from ozone and active oxygen, thus, a target, which is the hydrophilic/hydrophobic pattern, can be highly precisely formed. Moreover, in the hydrophilicity imparting step, the area to be made hydrophilic in the surface of the hydrophobic layer is uncovered, thus, the area can be made hydrophilic by the irradiation with an energy in a short period. Thus, a pattern formed body can be effectively manufactured. Furthermore, in a case where a pattern formed body manufactured by the manufacturing method of the pattern formed body of the invention is used to manufacture a functional element by forming a functional portion on the hydrophilic areas of the pattern formed body and subsequently further forming a member on the hydrophobic layer, areas other than the area to be made hydrophilic (hydrophilic area) are covered with the photoresist pattern in the hydrophilicity imparting step, so as to be protected from ozone and active oxygen, therefore, the state of the interface between the hydrophobic layer and the member can be made good so that characteristics of the element can be enhanced.

In the invention, the energy is preferably vacuum-ultraviolet ray. The vacuum-ultraviolet rays are high in energy intensity to make it possible to generate an oxygen active species more effectively to make the hydrophobic layer surface hydrophilic efficiently in a short period.

In the invention, the hydrophobic layer preferably comprises a functional layer formed on the substrate, and a layer exhibiting hydrophobicity formed on the functional layer. The hydrophobic layer is separated into the layers in accordance with individual functions of the layer. Thus, the hydrophobic layer can easily be changed in the layer structure thereof, the combination of materials therefor, and the like.

In the invention, the layer exhibiting hydrophobicity preferably contains organopolysiloxane. The organopolysiloxane is a preferred material having a contact angle onto pure water that can be lowered by irradiation with the energy.

In the invention, preferably, in the photoresist pattern formation step, a photoresist which contains a surfactant having a fluorine group is applied to the hydrophobic layer, and the photoresist is patterned to form the photoresist pattern. Even when the hydrophobicity of the hydrophobic layer surface is high, the use of the photoresist containing the fluorine-group-containing surfactant makes it possible to coat the photoresist satisfactorily on the hydrophobic layer.

The invention provides a manufacturing method of a functional element, comprising a functional portion formation step of coating a functional portion-formation coating on the hydrophilic area of the pattern formed body manufactured by the above-mentioned manufacturing method of the pattern formed body, thereby forming a functional portion.

Furthermore, the invention provides a manufacturing method of a semiconductor element, comprising a functional portion formation step of coating a functional portion-formation coating on the hydrophilic area of the pattern formed body manufactured by the above-mentioned manufacturing method of the pattern formed body, thereby forming a functional portion.

According to the invention, the pattern formed body manufactured by the above-mentioned manufacturing method of the pattern formed body is used, thus, the functional portion can be formed with a high precision. When a member is further formed on the hydrophobic layer after the functional portion formation step, areas other than the area made hydrophilic (hydrophilic area) are covered with the photoresist pattern in the hydrophilicity imparting step in the manufacturing method of the pattern formed body, so as to be protected from ozone and active oxygen. As a result, the state of the interface between the hydrophobic layer and the member can be made good so that the characteristics of the element can be improved.

In the invention, the semiconductor element is preferably a transistor or a diode. When the semiconductor element is the transistor or diode, excellent element characteristics can be obtained by improving the state of the interface between the hydrophobic layer and the member.

In the invention, preferably, the hydrophobic layer is an insulation layer, and the functional portion is an electrode or a semiconductor layer. This is because in a case where an electrode and a semiconductor layer are arranged near each other, the element characteristics may be deteriorated when a patterning precision in the electrode or the semiconductor layer declines.

Further, in the invention, preferably, a gate electrode is formed between the substrate and the hydrophobic layer, the hydrophobic layer is a gate insulation layer, and the functional portion is a source electrode and a drain electrode; and the method further comprises, after the functional portion formation step, a semiconductor layer formation step of forming a semiconductor layer is on the hydrophobic layer. In the case of a bottom gate/bottom contact structure, carries move in the interface between the hydrophobic layer and the semiconductor layer. According to the invention, areas other than the area made hydrophilic (hydrophilic area) are covered with the photoresist pattern in the hydrophilicity imparting step in the above-mentioned manufacturing method of the pattern formed body, so as to be protected from ozone and active oxygen. It is therefore possible to prevent an effect of the energy radiation onto the hydrophobic layer surface areas where the semiconductor layer is to be formed. Accordingly, the state of the interface between the hydrophobic layer and the semiconductor layer can be made good so that the characteristics of the element can be improved.

In the invention, the semiconductor layer is preferably an organic semiconductor layer. This is based on the following reasons: when the gate insulation film has hydrophobicity, the molecular orientation of the organic semiconductor material is improved to provide a large effect of improving the element characteristics; and the organic semiconductor layer also has advantages that the layer is made into a large area at relatively low costs and additionally the layer can be made into a film on a flexible substrate and is further stable against mechanical impact.

In the invention, the hydrophobic layer surface preferably has a contact angle of 100° or more onto pure water at 25° C., and in the semiconductor layer formation step, the organic semiconductor layer is preferably formed directly on the hydrophobic layer. When the hydrophobicity of the hydrophobic layer surface is high as described herein, the orientation of the organic semiconductor material can be improved.

In the invention, the semiconductor layer formation step preferably comprises: a second hydrophilicity imparting step of radiating an energy onto the surface of the hydrophobic layer where the functional portion is formed, thereby making the surface hydrophilic to form a second hydrophilic area; a surface modifying step of modifying a surface of the second hydrophilic area with an organic compound, thereby forming a surface-modified area; and an organic semiconductor layer formation step of forming the organic semiconductor layer on the surface-modified area. By conducting the second hydrophilicity imparting step and the surface modifying step after the functional portion formation step, the area where the organic semiconductor layer is formed can be made into a surface state that does not provide any bad effect onto the semiconductor characteristics. Moreover, by conducting the second hydrophilicity imparting step and the surface modifying step after the functional portion formation step, the wettability (hydrophobicity or hydrophilicity) of the area where the organic semiconductor layer is formed can be adjusted. Thus, when the organic semiconductor layer is formed by coating an organic semiconductor layer formation coating therefor, the coatability of this coating can be improved.

According to the invention, in the hydrophilicity imparting step, areas other than the area to be made hydrophilic (hydrophilic area) are covered with the photoresist pattern, so as to be protected from ozone and active oxygen, thus, a target, which is the hydrophilic/hydrophobic pattern, can be highly precisely formed. Furthermore, in a case where the pattern formed body is used to manufacture a functional element by forming a functional portion on the hydrophilic area of the pattern formed body and subsequently further forming a member on the hydrophobic layer, the areas other than the area to be made hydrophilic (hydrophilic area) are covered with the photoresist pattern so as to be protected from ozone and active oxygen in the hydrophilicity imparting step. Thus, the state of the interface between the hydrophobic layer and the member can be made good so that characteristics of the element can be heightened.

BRIEF DESCRIPTION OF THE DRAWINGS

FIGS. 2A to 2F are process charts illustrating another example of the manufacturing method of the pattern formed body of the invention.

DESCRIPTION OF THE PREFERRED EMBODIMENTS

Hereinafter, detailed descriptions are made about the method of the invention for manufacturing a pattern formed body, the method thereof for manufacturing a functional element, and the method thereof for manufacturing a semiconductor element.

A. Manufacturing Method of Pattern Formed Body

First, a description is made about a manufacturing method of a pattern formed body of the invention.

This method comprises: a photoresist pattern formation step of forming a photoresist pattern on a hydrophobic layer formed on a substrate and having a surface exhibiting hydrophobicity; a hydrophilicity imparting step of radiating an energy onto the surface of the hydrophobic layer on which the photoresist pattern is formed, thereby making the surface hydrophilic to form a hydrophilic area; and a photoresist pattern peeling step of peeling the photoresist pattern and forming a hydrophilic/hydrophobic pattern, on the hydrophobic layer surface, in which the hydrophilic area and a hydrophobic area covered previously with the photoresist pattern in the hydrophilicity imparting step are formed in a pattern form.

With some of the drawings, the manufacturing method of the pattern formed body of the invention is described.

FIGS. 1A to 1F are process charts illustrating an example of the method.

Figure 1A:
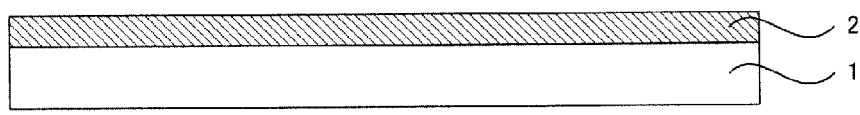
FIGS. 1A to 1F are process charts illustrating an example of a manufacturing method of the pattern formed body of the invention.
Figure 1B:
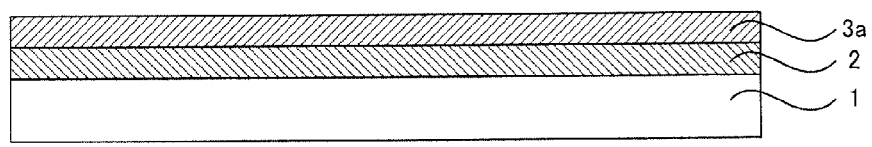
Figure 1C:
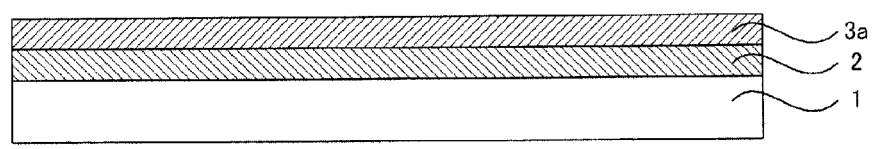
Figure 1D:
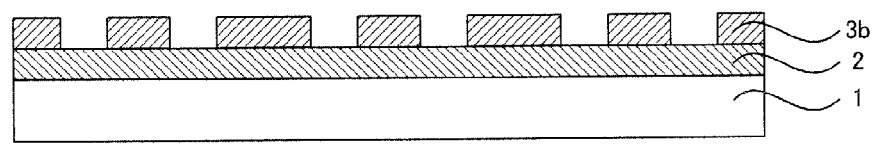
Figure 1E:
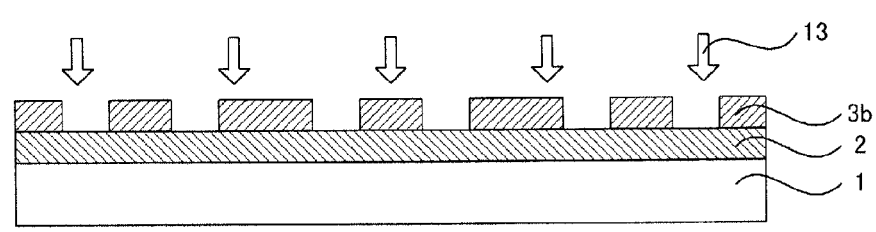
Figure 1F:
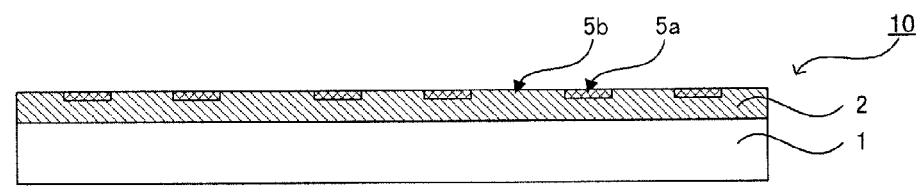

First, a hydrophobic layer 2 having a hydrophobic surface is formed on a substrate 1 (FIG. 1A). Next, a photoresist 3a is coated onto the hydrophobic layer 2 (FIG. 1B); and light rays 12 are radiated through a photomask 11 onto the workpiece (FIG. 1C), and then the workpiece is developed to form photoresist pattern 3b (FIG. 1D) [photoresist pattern formation step]. Next, the surface of the hydrophobic layer 2 on which the photoresist pattern 3b is formed is irradiated with vacuum-ultraviolet rays 13, so as to be made hydrophilic, thereby forming a hydrophilic area (FIG. 1E) [hydrophilicity imparting step]. Subsequently, the photoresist pattern 3b is peeled to form, on the surface of the hydrophobic layer 2, a hydrophilic/hydrophobic pattern, in which the hydrophilic area 5a and a hydrophobic area 5b covered previously with the photoresist pattern 3b in the hydrophilicity imparting step is formed in a pattern form (FIG. 1S) [photoresist pattern peeling step]. In this way, a pattern formed body 10 is obtained.

According to the invention, in the hydrophilicity imparting step, the area other than the area to be made hydrophilic (hydrophilic area) is covered with the photoresist pattern, so as to be protected from ozone and active oxygen; thus, a target, which is the hydrophilic/hydrophobic pattern, can be highly precisely formed. Moreover, in the hydrophilicity imparting step, the area to be made hydrophilic on the surface of the hydrophobic layer is uncovered, thus, the area can be made hydrophilic by the irradiation with the energy in a short period. Thus, a pattern formed body can be effectively manufactured.

Furthermore, in a case where a pattern formed body manufactured by the manufacturing method of the pattern formed body of the invention is used to manufacture a functional element by forming a functional portion on the hydrophilic area of the body and subsequently further forming a member on the hydrophobic layer, areas other than the area to be made hydrophilic (hydrophilic area) are covered with the photoresist pattern in the hydrophilicity imparting step, so as to be protected from ozone and active oxygen; thus, the state of the interface between the hydrophobic layer and the member can be made good so that characteristics of the element can be improved.

Hereinafter, a description is made about the hydrophobic layer and the individual steps in the manufacturing method of the pattern formed body of the invention.

1. Hydrophobic Layer

The hydrophobic layer in the invention is a layer formed on the substrate and having a surface exhibiting hydrophobicity.

The hydrophobicity of the hydrophobic layer surface is not particularly limited as far as the contact angle of the hydrophobic layer surface onto pure water at 25° C. is higher than that of the hydrophilic area surface, which is formed on the hydrophobic layer surface in the hydrophilicity imparting step, onto pure water at 25° C. The contact angle of the hydrophobic layer surface onto pure water at 25° C. is preferably 80° or more, and in particular preferably 100° or more.

The contact angle of any surface may be measured, for example, by dropping out a liquid of 1 μL volume onto the substrate, observing the shape of the dropped liquid droplet from a side thereof, and measuring up the angle made between the droplet and the substrate. The measurement may be made by means of, for example, a contact angle measuring instrument manufactured by Imoto Machinery Co., Ltd.

The hydrophobic layer is not particularly limited as far as the layer is formed on the substrate and has a surface exhibiting hydrophobicity. The layer is appropriately selected in accordance with factors such as the usage of the pattern formed body, the degree of the hydrophilicity of the hydrophilic area formed on the hydrophobic layer surface formed in the hydrophilicity imparting step, which will be detailed later. The hydrophobic layer may be, for example, a single layer containing a hydrophobic material (hydrophobic layer of a first embodiment), or a layer, in which a functional layer having a predetermined function and a layer exhibiting hydrophobicity are laminated onto each other (hydrophobic layer of a second embodiment). Hereinafter, the embodiments are described independently of each other.

(1) Hydrophobic Layer of First Embodiment

The hydrophobic layer of the present embodiment is a single layer containing a hydrophobic material. According to the embodiment, the layer structure of the pattern formed body can be made simple since this layer is a single layer.

The hydrophobic material is not particularly limited as far as a contact angle of the material onto pure water can be lowered when irradiated with an energy. The material is appropriately selected in accordance with factors such as the usage of the pattern formed body, the degree of the hydrophilicity of the hydrophilic area formed in the hydrophilicity imparting step, which will be detailed later. The hydrophobic material may be an organic material or an inorganic material. Specific examples of the hydrophobic material include a polyimide resin, an acrylic resin, an epoxy resin, a polyvinyl resin, and $SiO_2$ (silicon oxide) having a surface subjected to modifying treatment with HMDS (hexamethyldisilane), OTS (octadecyltrichlorosilane), or the like. These may be used alone or in combination of two or more thereof.

The hydrophobic material may be a material which has a contact angle onto pure water that can be lowered when irradiated with an energy and which has a main chain having a high bond energy so as not to be deteriorated or decomposed by the energy irradiation. An example of this material includes an organopolysiloxane. The organopolysiloxane is preferably an organopolysiloxane having an alkyl or fluoroalkyl group. In the case of the alkyl- or fluoroalkyl-containing organopolysiloxane, the contact angle onto pure water is largely lowered by the energy irradiation.

Species of the organopolysiloxane may be the same as described in, for example, JP-A-2000-249821.

The method for forming the hydrophobic layer is appropriately selected in accordance with the kinds of the hydrophobic material.

The thickness of the hydrophobic layer is appropriately selected in accordance with factors such as the usage of the pattern formed body. For example, in a case where the pattern formed body is used to manufacture a transistor and the hydrophobic layer is a gate insulation film of the transistor, the thickness of the hydrophobic layer may be set into the range of 0.01 to 10 μm, is preferably from 0.1 to 5 and more preferably from 0.5 to 1 μm.

(2) Hydrophobic Layer of Second Embodiment

As illustrated in FIG. 2A, a hydrophobic layer 2, as an example of the hydrophobic layer of the embodiment, is a layer comprising a functional layer 2a formed on a substrate 1 and having a predetermined function, and a layer exhibiting hydrophobicity 2b formed on the functional layer 2a. In the embodiment, the hydrophobic layer 2 is separated into the two layers in accordance with individual functions of the layer 2. Thus, the hydrophobic layer 2 can easily be changed in the layer structure thereof, the combination of materials therefor, and others. As illustrated in FIGS. 2A to 2F, in this case, a hydrophilic/hydrophobic pattern, in which the hydrophilic area 5a and the hydrophobic area 5b are formed in a pattern form, is formed on the surface of the layer exhibiting hydrophobicity 2b.

Hereinafter, the functional layer and the layer exhibiting hydrophobicity are described independently of each other.

(a) Functional Layer

The functional layer used in the embodiment is a layer having a predetermined function.

The material of the functional layer is appropriately selected in accordance with factors such as the usage of the pattern formed body. In the case of using the pattern formed body to form, for example, a source electrode, a drain electrode, a gate electrode or a semiconductor layer of a transistor or diode, the hydrophobic layer may be rendered a gate insulation film and an insulating material may be used for the functional layer.

The method for forming the functional layer is appropriately selected in accordance with the kinds of the material of the functional layer.

The thickness of the functional layer is appropriately selected in accordance with factors such as the usage of the pattern formed body.

(b) Layer Exhibiting Hydrophobicity

The hydrophobicity of the layer exhibiting hydrophobicity is not particularly limited as far as the contact angle of the surface of the layer exhibiting hydrophobicity onto pure water at 25° C. is higher than that of the hydrophilic area surface, which is formed on the surface of the layer exhibiting hydrophobicity in the hydrophilicity imparting step, onto pure water at 25° C. The contact angle of the surface of the layer exhibiting hydrophobicity onto pure water at 25° C. is preferably 80° or more, and in particular preferably 100° or more.

The material of the layer exhibiting hydrophobicity is not particularly limited as far as the contact angle of the material onto pure water can be lowered when irradiated with an energy and which has a main chain having a high bond energy so as not to be deteriorated or decomposed by the energy irradiation. The material is appropriately selected in accordance with the usage of the pattern formed body, the degree of the hydrophilicity of the hydrophilic area formed on the surface of the layer exhibiting hydrophobicity in the hydrophilicity imparting step, which will be detailed later, or some other factor. The material of the layer exhibiting hydrophobicity may be an organic material or an inorganic material. A specific example of the material for the layer exhibiting hydrophobicity is an organopolysiloxane. The organopolysiloxane is in particular preferably an organopolysiloxane containing an alkyl or fluoroalkyl group. This is because in the case of the alkyl- or fluoroalkyl-containing organopolysiloxane, the contact angle onto pure water is largely lowered by the energy irradiation.

Kinds of the organopolysiloxane may be the same as described in, for example, JP-A No. 2000-249821.

The layer exhibiting hydrophobicity may contain, besides the organopolysiloxane, any surfactant or any additive described in, for example, JP-A No. 2000-249821.

The method for forming the layer exhibiting hydrophobicity is appropriately selected in accordance with the kinds of the material of the layer exhibiting hydrophobicity. The method may be, for example, a wet method such as spin coating, spray coating, roll coating, bead coating or dip coating; or a dry method such as any CVD method like thermal CVD or plasma CVD, or any PVD method like vacuum evaporation, sputtering or ion plating.

The thickness of the layer exhibiting hydrophobicity is appropriately selected in accordance with factors such as the usage of the pattern formed body. The thickness of the layer exhibiting hydrophobicity may be set into the range of, for example, 0.01 to 1 μm, and is preferably from 0.05 to 0.1 μm.

(3) Substrate

The substrate used in the invention is a member which supports the hydrophobic layer.

The substrate is appropriately selected in accordance with factors such as the usage of the pattern formed body. Examples of the material of the substrate include glass, metal, ceramic material, and a resin. The substrate may be a rigid substrate, which has no flexibility, such as a glass substrate, or may be a flexible substrate, which has flexibility, such as a resin film.

2. Photoresist Pattern Formation Step

Photoresist pattern formation step in the invention is a step of forming a photoresist pattern on the hydrophobic layer.

The method for forming the photoresist pattern on the hydrophobic layer is not particularly limited as far as it makes possible to form the photoresist pattern on the hydrophobic layer. Usually, a method of coating a photoresist on the hydrophobic layer, and then patterning the resist to form the photoresist pattern is used.

The photoresist may be of a positive or negative type. Considering easiness of the peeling of the photoresist pattern in the photoresist pattern peeling step, which will be detailed later, the photoresist is preferably a positive type photoresist The photoresist may be any ordinary photoresist.

It is preferred that the photoresist contains a surfactant containing a fluorine group. This photoresist makes it possible to decrease the surface tension of the photoresist effectively; thus, even when the hydrophobicity of the hydrophobic layer surface is high, the photoresist can be satisfactorily coated on the hydrophobic layer. The fluorine-group-containing surfactant is not particularly limited as far as the surfactant is soluble in the photoresist. The surfactant may be of either a high molecular weight type or a low molecular weight type, and may be any ordinary fluorine-containing surfactant.

The photoresist preferably have a contact angle of 15° or less, in particular, 10° or less onto the hydrophobic layer surface. When the contact angle is in this range, the photoresist can be satisfactorily coated on the hydrophobic layer.

The method for coating the photoresist is not particularly limited as far as the method is a method making it possible to coat the resist on the hydrophobic layer. The method may be, for example, spin coating, casting, dip coating, bar coating, blade coating, roll coating, gravure coating, spray coating or flexo printing.

The film thickness of the photoresist is not particularly limited as far as the thickness of the photoresist can endure the energy irradiation in the hydrophilicity imparting step, which will be detailed later.

The method for the patterning of the photoresist may be ordinarily a method of radiating light into a pattern form onto the photoresist, and then developing the photoresist.

The method of radiating light in to a pattern form onto the photoresist may be any ordinary manner, such as a method of radiating light through a photomask onto the photoresist, or a laser drawing manner.

The method of developing the photoresist may be, for example, a method of using a developing solution. The developing solution may be an ordinarily used organic alkali type developing solution. The developing solution may be an inorganic alkali developing solution or an aqueous solution.

After the development of the photoresist, the workpiece is preferably washed with water.

The photoresist pattern is not particularly limited as far as the desired hydrophilic area can be formed, and is appropriately selected in accordance with factors such as the usage of the pattern formed body.

3. Hydrophilicity Imparting Step

Hydrophilicity imparting step in the invention is a step of radiating an energy onto the surface of the hydrophobic layer on which the photoresist pattern is formed, thereby making the surface hydrophilic to form the hydrophilic area.

The energy radiated onto the surface of the hydrophobic layer is not particularly limited as far as the energy makes it possible to make the hydrophobic layer surface hydrophilic. Examples thereof include ultraviolet rays and an electron beam. The energy is in particular preferably vacuum-ultraviolet rays since the vacuum-ultraviolet rays are high in energy intensity to make it possible to generate an oxygen active species more effectively, thereby make the hydrophobic layer surface hydrophilic efficiently in a short period.

The wavelength of the vacuum-ultraviolet rays may be any wavelength capable of making the hydrophobic layer surface hydrophilic, and is appropriately selected in accordance with the kinds of the material of the hydrophobic layer. Usually, the wavelength is preferably in the range of 100 to 250 nm, and in particular preferably in the range of 150 to 200 nm. If the wavelength is longer than the range, the generation efficiency of oxygen radicals is declined so that depending on the kinds of the hydrophobic layer material, the sensitivity of the material thereto unfavorably deteriorates. If the wavelength is shorter than the range, stable radiation of the vacuum-ultraviolet rays may become difficult.

The light source usable for the radiation of the vacuum-ultraviolet rays may include, for example, an excimer lamp, a low-pressure mercury lamp, or some other lamp that may be of various types.

The radiation quantity of the vacuum-ultraviolet rays is appropriately adjusted in accordance with the kinds of the material of the hydrophobic layer.

The method for radiating the vacuum-ultraviolet rays onto the hydrophobic layer is not particularly limited as far as the method is a method making it possible to radiate the vacuum-ultraviolet rays uniformly on the hydrophobic layer. The method includes, for example, a method of radiating the vacuum-ultraviolet rays simultaneously on the entire surface of the hydrophobic layer, or a method in which while at least one of the light source and the substrate on which the hydrophobic layer is formed is shifted, individual regions of the hydrophobic layer are successively irradiated therewith. The latter method is preferred for the following reason.

Vacuum-ultraviolet rays are dispersed light rays, which have no directivity. Thus, according to the former method (radiating the vacuum-ultraviolet rays simultaneously on the entire surface of the hydrophobic layer), at the time of radiating vacuum-ultraviolet rays onto, for example, the hydrophobic layer which has a large area, a difference in the radiation quantity of the vacuum-ultraviolet rays may be generated between its central region and its end region. However, according to the latter method (individual regions of the hydrophobic layer are successively irradiated), even at the time of radiating vacuum-ultraviolet rays onto the hydrophobic layer which has a large area, the rays can uniformly be radiated with ease onto the entire surface.

Of various manners for the latter method, preferred is a manner of fixing the substrate on which the hydrophobic layer is formed, and radiating vacuum-ultraviolet rays onto the substrate while the light source is shifted. According to this manner, the vacuum-ultraviolet rays can uniformly be radiated with ease onto the hydrophobic layer which has a large area.

The radiation of the vacuum-ultraviolet rays is usually conducted in the presence of oxygen.

The hydrophilicity of the hydrophilic area is not particularly limited as far as the contact angle of the hydrophilic area surface onto pure water at 25° C. is lower than that of the hydrophobic layer surface onto pure water at 25° C. before the hydrophilicity imparting step. The contact angle of the hydrophilic area surface onto pure water at 25° C. is preferably 30° or less, more preferably 10° or less, and even more preferably 5° or less. Between the hydrophilic area surface, and the hydrophobic layer surface before the hydrophilicity imparting step, the difference in contact angle onto pure water at 25° C. is preferably 50° or more, more preferably 70° or more, even more preferably 80° or more, and in particular preferably 90° or more. In a case where the pattern formed body is used to manufacture a functional element, the setting of the contact angle and the contact angle difference into the respective ranges described just above makes it possible that a functional portion-formation coating therefor is given to the hydrophilic area with a higher selectivity. As a result, the functional portion can be formed with a high precision.

4. Photoresist Pattern Peeling Step

Photoresist pattern peeling step in the invention is step of peeling the photoresist pattern, thereby forming, on the hydrophobic layer surface, a hydrophilic/hydrophobic pattern in which the hydrophilic area and the hydrophobic area covered previously with the photoresist pattern in the hydrophilicity imparting step are formed in a pattern form.

The "hydrophilic area" is an area where the hydrophobic layer surface is made hydrophilic in the hydrophilicity imparting step, and the "hydrophobic area" is an area where the hydrophobic layer surface is covered previously with the photoresist pattern in the hydrophilicity imparting step.

Between the hydrophobic layer surface and the hydrophilic area surface, the difference in contact angle onto pure water at 25° C. is preferably 50° or more, more preferably 70° or more, even more preferably 80° or more, and in particular preferably 90° or more. In a case where the pattern formed body is used to manufacture a functional element, the setting of this contact angle difference into the range described just above makes it easy to form the functional portion only on the hydrophilic area.

The method for peeling the photoresist is, for example, a method using, for example, an organic solvent such as acetone or toluene, or a peeling solution. The peeling solution may be an ordinarily used peeling solution.

5. Usage

The pattern formed body manufactured by the manufacturing method of the pattern formed body of the invention may be used for, for example, an electrode or semiconductor layer of a semiconductor element, a wiring of a wired board, a luminous layer or some other organic layer of an organic EL element, a color filter, a micro lens, or a biochip.

B. Manufacturing Method of Functional Element

Next, a description is made about a manufacturing method of a functional element of the invention.

The manufacturing method of the functional element of the invention comprises a functional portion formation step of coating a functional portion-formation coating on the hydrophilic area of the pattern formed body manufactured by the above-mentioned manufacturing method of the pattern formed body, thereby forming a functional portion.

Figure 3A:
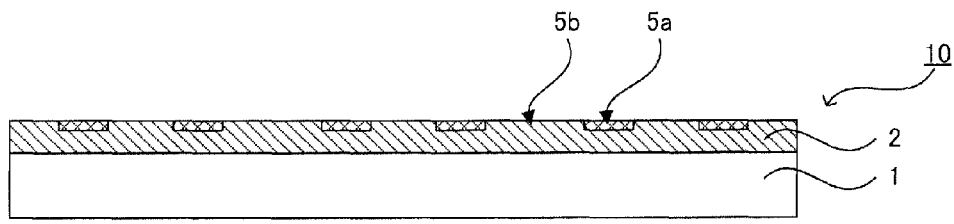
FIGS. 3A and 3B are process charts illustrating an example of a manufacturing method of the functional element of the invention.
Figure 3B:
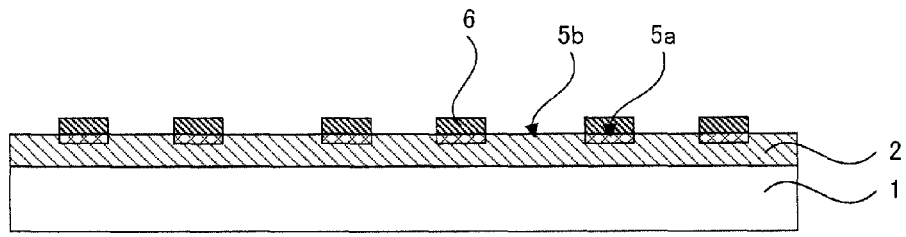

FIGS. 3A and 3B are process charts illustrating an example of this method. First, prepared is a pattern formed body 10 by the above-mentioned manufacturing method of the pattern formed body (FIG. 3A). The pattern formed body 10 illustrated in FIG. 3A may be manufactured by the manufacturing method of the pattern formed body illustrated in FIGS. 1A to 1F. Next, a functional portion-formation coating is coated onto the hydrophilic area 5a of the pattern formed body 10 to form a functional portion 6 (FIG. 3B) [functional portion formation step].

According to the invention, the pattern formed body manufactured by the above-mentioned manufacturing method of the pattern formed body is used, thus, the functional portion can be highly precisely formed. Moreover, in a case where, after the functional portion formation step, a member is further formed on the hydrophobic layer, areas other than the area to be made hydrophilic (hydrophilic area) are covered with the photoresist pattern in the above-mentioned hydrophilicity imparting step of the manufacturing method of the pattern formed body, so as to be protected from ozone and active oxygen, thus, the state of the interface between the hydrophobic layer and the member can be made good. As a result, characteristics of the element can be improved.

About the manufacturing method of the pattern formed body, and the pattern formed body, a description thereof is omitted herein since the same has been described in detail in the item "A. Manufacturing method of pattern formed body". Hereinafter, a description is made about the functional portion formation step, and the functional element.

1. Functional Portion Formation Step

Functional portion formation step in the invention is a step of coating a functional portion-formation coating on the hydrophilic area of the pattern formed body manufactured by the above-mentioned manufacturing method of the pattern formed body, thereby forming a functional portion.

The word "functional" referred to herein means optical functions (such as selective light absorbability, reflectivity, polarizability, selective light transmissibility, nonlinear optical property, a luminescence such as fluorescence or phosphorescence, and photochromism), magnetic functions (such as hard magnetism, soft magnetism, non-magnetism, and permeability), electrical/electric functions (such as electroconductivity, insulative properties, piezoelectricity, pyroelectricity, and dielectricity), chemical functions (such as adsorbability, desorbability, catalytic property, water absorbability, ion conductivity, oxidizability and reducibility, electrochemical property, and electrochromism), mechanical functions (such as abrasion resistance), thermal functions (such as thermal conductivity, adiabaticity, and infrared ray radiative property), bioactivities (such as biocompatibility and antithrombogenicity), and other various functions.

The functional portion-formation coating is a solution containing at least a functional material. The functional material is appropriately selected in accordance with factors such as the kinds and usage of the functional element. Examples of the material are a semiconductor material, a light emitting material, a hole injecting material such as PEDOT/PSS, an electroconductive material such as metallic nano-colloid, a coloring material, a resin material, or a biological material such as a protein, a cell or DNA.

The method for coating the functional portion-formation coating on the hydrophilic area is not particularly limited as far as the method makes it possible to form the functional portion only on the hydrophilic area. The method is appropriately selected in accordance with the difference in contact angle onto pure water between the hydrophilic area surface and the hydrophobic area surface. When this difference is large, use may be made of any one of a method of coating the functional portion-formation coating on the entire surface of the hydrophobic layer, and a method of coating the functional portion-formation coating only on the hydrophilic area. In the meantime, when the difference is small, use is made of the method of coating the functional portion-formation coating only on the hydrophilic area. Examples of the former method (coating the functional portion-formation coating on the entire surface of the hydrophobic layer) include spin coating, die coating, roll coating, bar coating, dip coating, spray coating, blade coating, and gravure offset printing. Examples of the latter method (coating the functional portion-formation coating only on the hydrophilic area) include ink-jetting, a method using a dispenser, and other jetting methods.

2. Functional Element

The functional element manufactured by the manufacturing method of the functional element of the invention may be, for example, a semiconductor element such as a transistor or a diode, an organic EL element, a color filter, a micro lens, or a biochip.

C. Manufacturing Method of Semiconductor Element

Next, a description is made about a manufacturing method of a semiconductor element of the invention.

The manufacturing method of the semiconductor element of the invention comprises a functional portion formation step of coating a functional portion-formation coating on the hydrophilic area of the pattern formed body manufactured by the above-mentioned manufacturing method of the pattern formed body, thereby forming a functional portion.

With reference to some of the drawings, this method is described.

Figure 4A:
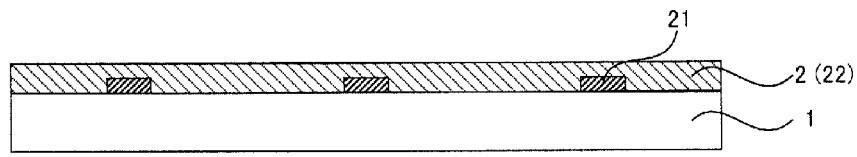
FIGS. 4A to 4F are process charts illustrating still another example of the manufacturing method of the pattern formed body of the invention.
Figure 4B:
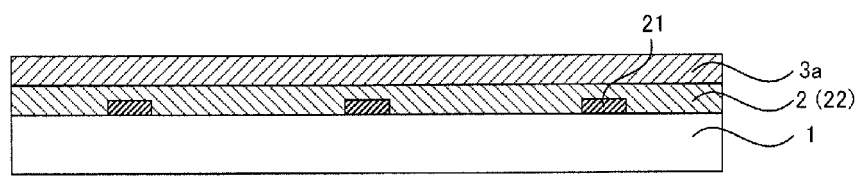
Figure 4C:
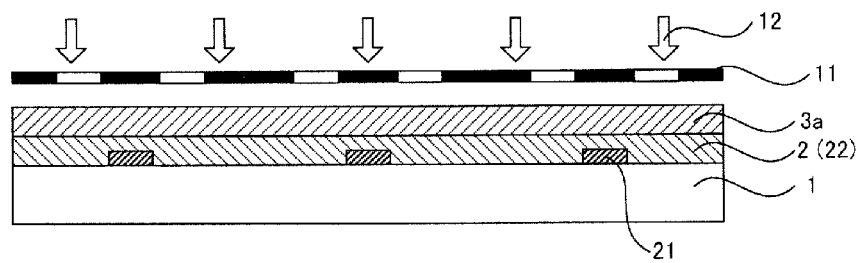
Figure 4D:
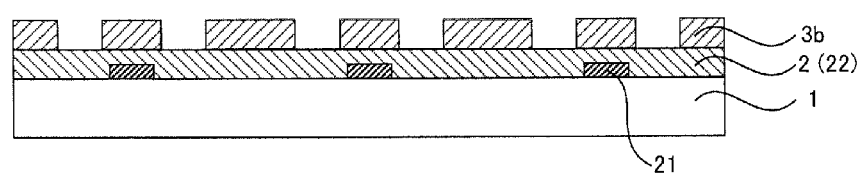
Figure 4E:
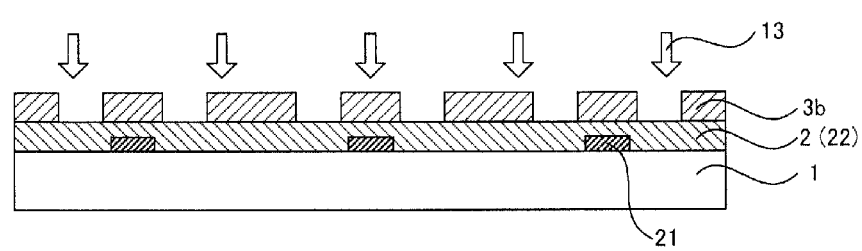
Figure 4F:
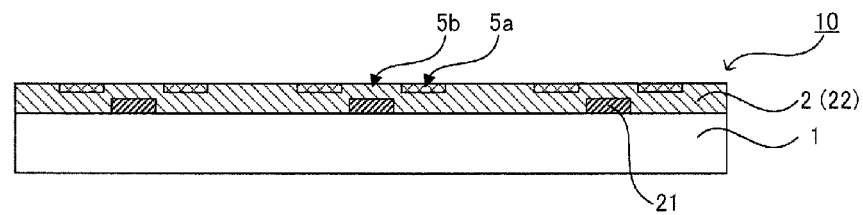

FIGS. 4A to 4F and FIGS. 5A to 5C are process charts respectively illustrating an example of the manufacturing method of the semiconductor element of the invention, and explain an example in which a source electrode and a drain electrode are formed as functional portions. First, a gate electrode 21 is formed on a substrate 1, and a hydrophobic layer 2 (gate insulation layer 22) having a surface exhibiting hydrophobicity is formed on the substrate 1 so as to cover the gate electrodes 21 (FIG. 4A). Next, a photoresist 3a is coated onto the hydrophobic layer 2 (FIG. 4B). Light rays 12 are radiated through a photomask 11 onto the workpiece (FIG. 4C), and the photoresist 3a is developed to form photoresist pattern 3b (FIG. 4D) [photoresist pattern formation step]. Next, the surface of the hydrophobic layer 2, on which the photoresist pattern 3b is formed, is irradiated with vacuum-ultraviolet ray 13 to make the surface hydrophilic, thereby forming the hydrophilic area (FIG. 4E) [hydrophilicity imparting step]. Subsequently, the photoresist pattern 3b is peeled to form, on the surface of the hydrophobic layer 2, a hydrophilic/hydrophobic pattern, in which the hydrophilic area 5a and hydrophobic area 5b covered previously with the photoresist pattern 3b in the hydrophilicity imparting step are formed into a pattern form (FIG. 4F and FIG. 5A) [photoresist pattern peeling step]. In this way, a pattern formed body 10 is obtained.

Next, a functional portion-formation coating is coated onto the hydrophilic area 5a of the pattern formed body 10 to form a source electrode 23 and a drain electrode 24 (FIG. 5B) [functional portion formation step]. Next, a semiconductor layer 25 is formed on the hydrophobic layer 2 (gate insulation film 22) and between the source electrode 23 and the drain electrode 24 (FIG. 5C) [semiconductor layer formation step]. In this way, a semiconductor element 20 is formed. This semiconductor element is composed of transistors or diodes each having a bottom gate/bottom contact structure.

Figure 6A:
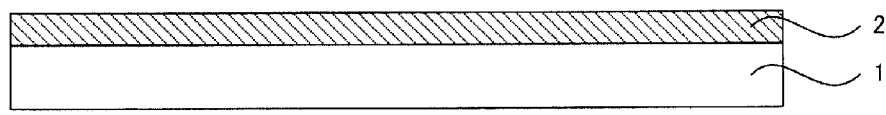
FIGS. 6A to 6F process charts illustrating a further example of the manufacturing method of the pattern formed body of the invention.
Figure 6B:
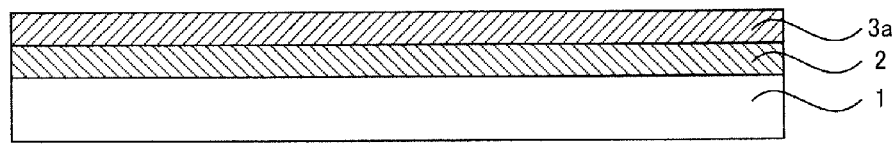
Figure 6C:
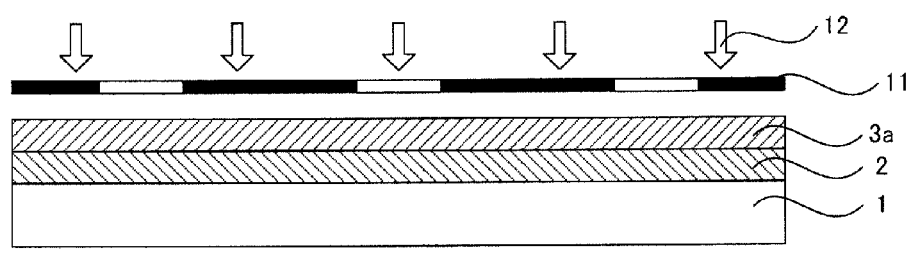
Figure 6D:
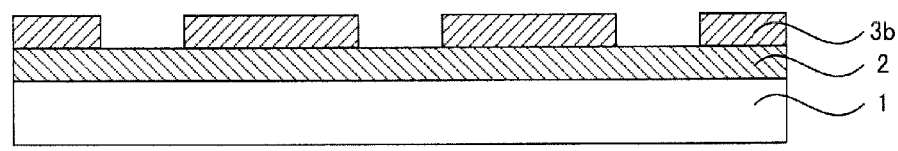
Figure 6E:
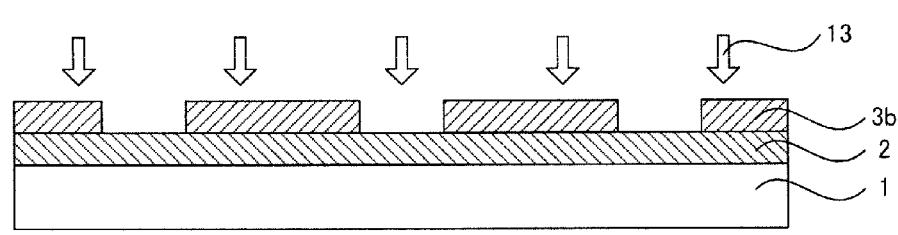
Figure 6F:
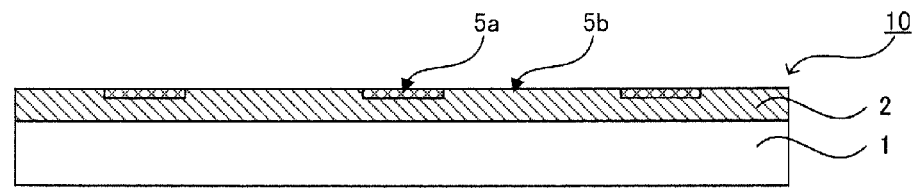

FIGS. 6A to 6F and FIGS. 7A to 7E are process charts illustrating another example of the manufacturing method of the semiconductor element of the invention and show an example wherein a semiconductor layer is formed as a functional portion. First, a hydrophobic layer (insulation film) 2 having a surface exhibiting hydrophobicity is formed on a substrate 1 (FIG. 6A). Next, a photoresist 3a is coated onto the hydrophobic layer 2 (FIG. 6B). Light rays 12 are radiated through a photomask 11 onto the workpiece (FIG. 6C), and the photoresist 3a is developed to form a photoresist pattern 3b (FIG. 6D) [photoresist pattern formation step]. Next, the surface of the hydrophobic layer 2, on which the photoresist pattern 3b is formed, is irradiated with vacuum-ultraviolet ray 13 to make the surface hydrophilic, thereby forming the hydrophilic area (FIG. 6E) [hydrophilicity imparting step]. Subsequently, the photoresist pattern 3b is peeled to form, on the surface of the hydrophobic layer 2, a hydrophilic/hydrophobic pattern, in which the hydrophilic area 5a and the hydrophobic area 5b covered previously with the photoresist pattern 3b in the hydrophilicity imparting step, is formed into a pattern form (FIG. 6F and FIG. 7A) [photoresist pattern peeling step]. In this way, a pattern formed body 10 is obtained.

Figure 7A:
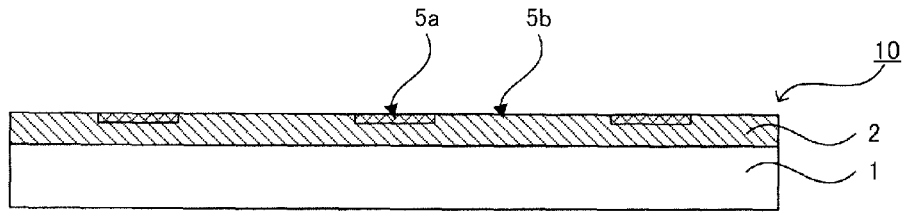
FIGS. 7A to 7E are process charts illustrating another example of a manufacturing method of a semiconductor element of the invention.
Figure 7B:
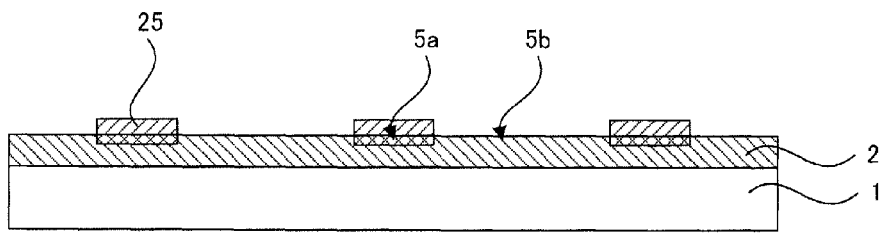
Figure 7C:
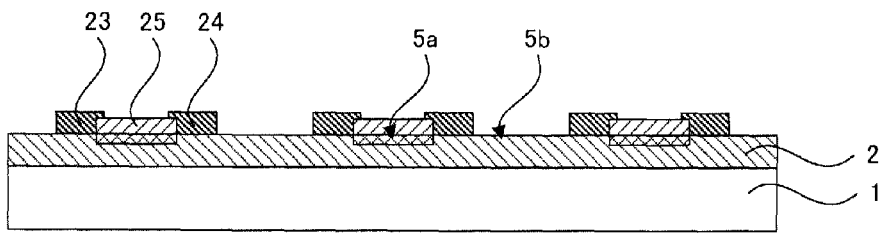
Figure 7D:
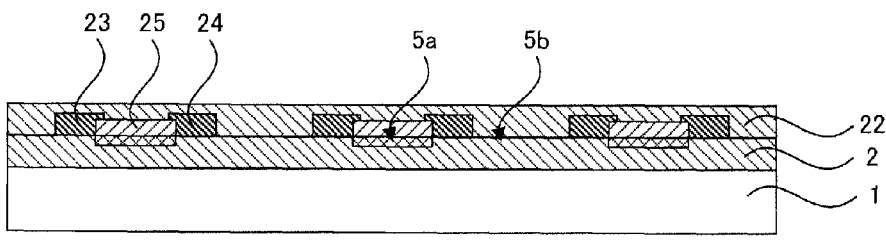
Figure 7E:
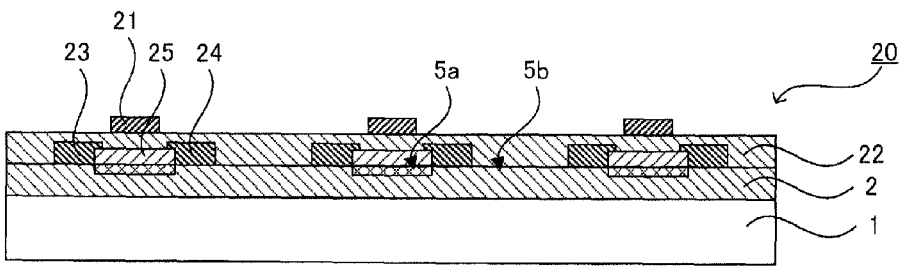
Figure 8A:
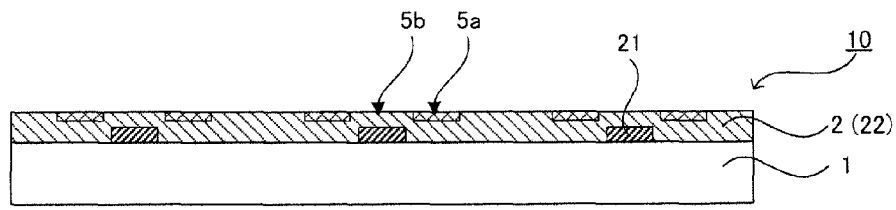
FIGS. 8A to 8F are process charts illustrating still another example of the manufacturing method of the semiconductor element of the invention.
Figure 8B:
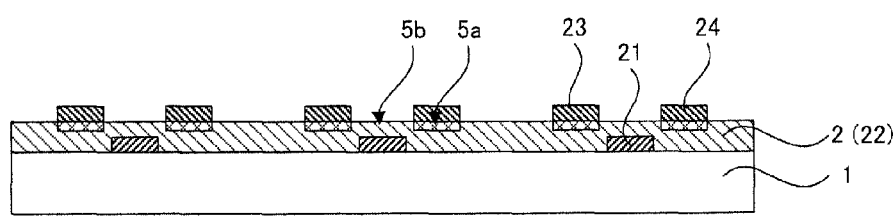
Figure 8C:
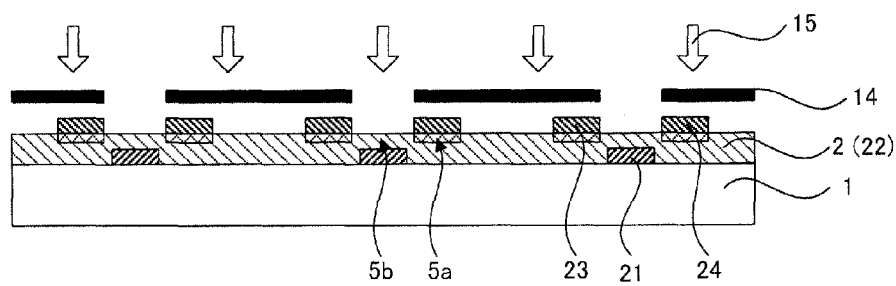
Figure 8D:
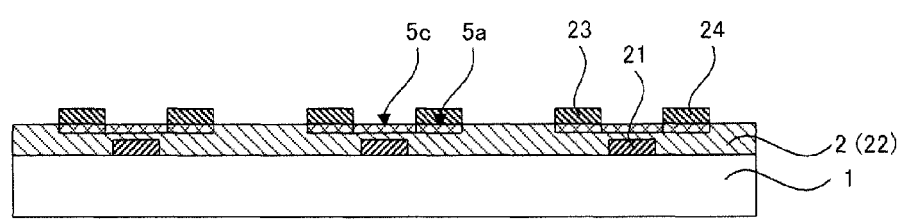
Figure 8E:
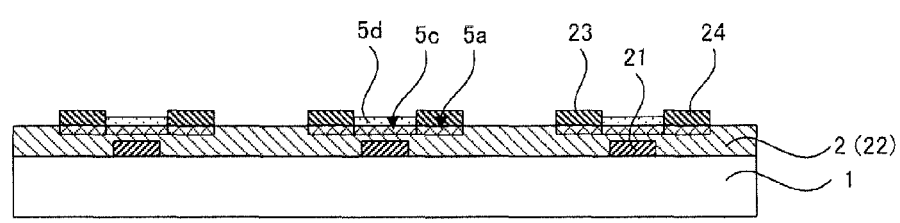
Figure 8F:
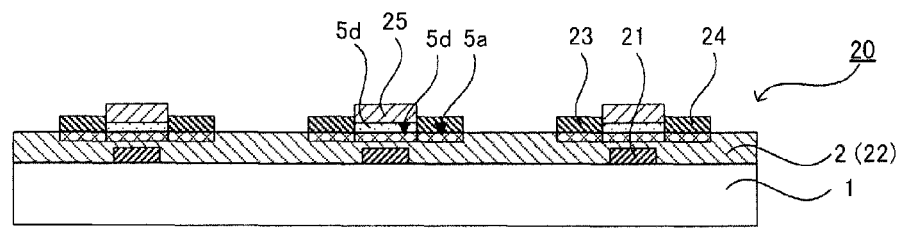

Next, a semiconductor layer formation coating is coated onto the hydrophilic area 5a of the pattern formed body 10 to form a semiconductor layer 25 (FIG. 7B) [functional portion formation step]. Next, the source electrode 23 and the drain electrode 24 are formed on the hydrophobic layer (insulation layer) 2 so as to sandwich each piece of the semiconductor layer 25 (FIG. 7C). Subsequently, a gate insulation layer 22 is formed to cover the source electrode 23 and the drain electrode 24 (FIG. 7D). A gate electrode 21 is formed on the gate insulation layer 22 (FIG. 7E). In this way, a semiconductor element 20 is obtained. This semiconductor element is composed of transistors or diodes each having a top gate/top contact structure.

According to the invention, the functional portion can be formed with a high precision since use is made of the pattern formed body manufactured by the above-mentioned manufacturing method of the pattern formed body.

Figure 5A:
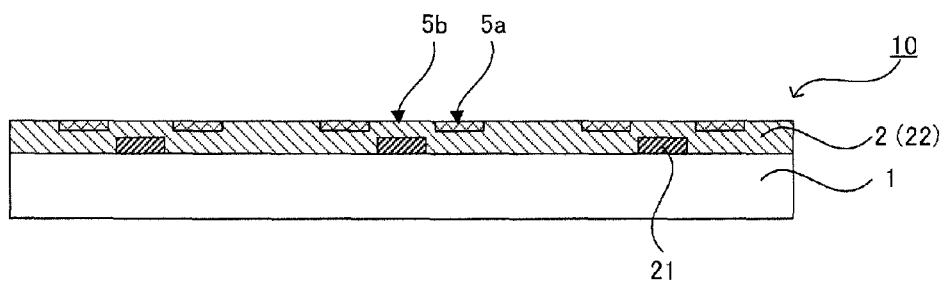
FIGS. 5A to 5C are process charts illustrating an example of the manufacturing method of the semiconductor element of the invention.
Figure 5B:
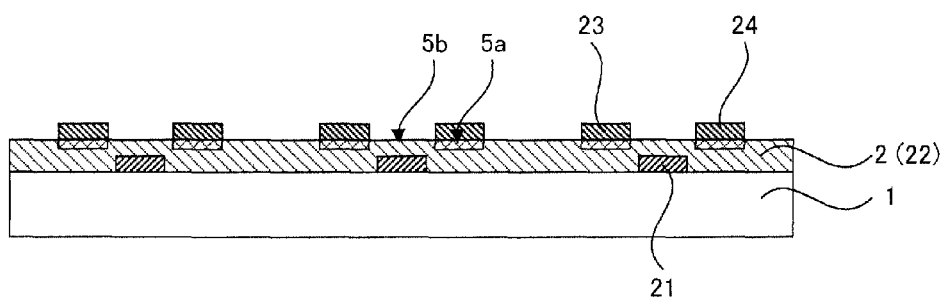
Figure 5C:
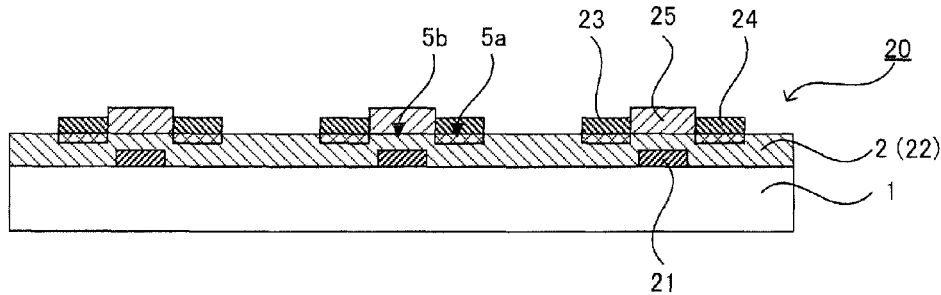

In particular, in the transistor illustrated in FIG. 5C, which has a bottom gate/bottom contact structure, carriers are shifted in the interface between the hydrophobic layer 2 (gate insulation film 22) and the semiconductor layer 25; therefore, in order to obtain good transistors characteristics, the following are important: the smoothness of the interface between the hydrophobic layer 2 (gate insulation film 22) and the semiconductor layer 25, and the surface state of the hydrophobic area 5b. As described above, in the invention, the areas other than the area to be made hydrophilic (hydrophilic area 5a) are covered with the photoresist pattern so as to be protected from ozone and active oxygen, thus, the formation of OH groups, which may cause carrier trapping in the surface of the hydrophobic area 5b, is restrained so that the state of the interface between the hydrophobic layer 2 and the semiconductor layer 25 can be made good. As a result, a semiconductor element excellent in transistor characteristics such as on-off-current ratio, threshold voltage $V_{th}$, and mobility can be manufactured.

FIGS. 4A to 4F and FIGS. 5A to 5C are views respectively illustrating an example of a manufacturing method of transistors or diodes each having a bottom gate/bottom contact structure, and FIGS. 6A to 6F and FIGS. 7A to 7E are views respectively illustrating an example of a method for manufacturing transistors or diodes each having a top gate/top contact structure. However, the invention is not limited to these methods. Thus, the invention may be applied to any manufacture of transistors or diodes having a bottom gate/top contact structure or a top gate/bottom contact structure (this situation is not illustrated).

Hereinafter, a description is made about each of steps in the method of the invention for manufacturing a semiconductor element, and the semiconductor element.

1. Functional Portion Formation Step

Functional portion formation step in the invention is step of coating a functional portion-formation coating on the hydrophilic area of the pattern formed body manufactured by the above-mentioned manufacturing method of the pattern formed body, thereby forming the functional portion.

Hereinafter, a description is made about a method for forming the functional portion, and the pattern formed body.

(1) Method for Forming the Functional Portion

The functional portion-formation coating used in the invention contains at least a functional material. The functional material is appropriately selected in accordance with factors such as the kinds of the functional portion(s) constituting the semiconductor element. For example, when the electrode is formed as the functional portion, the material is, for example, an electroconductive material; and when the semiconductor layer is formed as the functional portion(s), the material is a semiconductor material.

The method for coating the functional portion-formation coating on the hydrophilic area is not particularly limited as far as the method makes it possible to form the functional portion only on the hydrophilic area. Examples thereof include dip coating, die coating, bead coating, spin coating, ink-jetting, a manner using a dispenser, blade coating, flexo printing, and gravure printing.

The functional portion is not particularly limited as far as the functional portion is a member which constitutes the semiconductor element and is further required to be patterned. The member is preferably, for example, an electrode, a wiring, or a semiconductor layer. The functional portion is in particular preferably an electrode or a semiconductor layer for the following reason: when an electrode and a semiconductor layer are arranged near each other, the patterning precision of the electrode or the semiconductor layer may fall, and characteristics of the element may deteriorate.

When the functional portion is an electrode, the electrode may be, for example, a gate electrode, source/drain electrodes, a positive electrode, or a negative electrode. In the invention, the semiconductor element is preferably a transistor or a diode, as will also be described later; thus, the functional portion is preferably a gate electrode or source/drain electrodes, and is in particular preferably source/drain electrodes for the following reason: as described above, in transistors or diodes each having a bottom gate/bottom contact structure as illustrated in FIG. 5C, the state of the interface between the hydrophobic layer 2 (gate insulation film 22) and the semiconductor layer 25 can be made good so that characteristics of the element can be improved.

When the functional portion is an electrode, the functional portion-formation coating is not particularly limited as far as the solution contains an electroconductive material. The solution may be an ordinary functional portion-formation coating. The method for forming the electrode as the functional portion may also be an ordinary method.

When a gate electrode is formed as the functional portion, the electroconductive material may be, for example, particles made of a metal or metal oxide such as Au, Cu, Ag, ITO or Pt, a carbonaceous material such as graphene or carbon nanotube, or an electroconductive polymeric material such as PEDOT/PSS. The thickness of the gate electrode may be set into the range of about 30 nm to 500 nm.

When a source electrode and a drain electrode are formed as the functional portion, the electroconductive material may be, for example, particles made of a metal or metal oxide such as Au, Cu, Ag, ITO or Pt, a carbonaceous material such as graphene or carbon nanotube, or an electroconductive polymeric material such as PEDOT/PSS. The thickness of the source electrode and the drain electrode may be set into the range of about 30 nm to 500 nm.

When a semiconductor layer is formed as the functional portion, a semiconductor material is used. The semiconductor material may be an inorganic semiconductor material or an organic semiconductor material.

A coatable inorganic semiconductor material may be Si, or an InGaZnO based oxide semiconductor, and examples thereof include materials described in JP-A Nos. 2005-223138, and 2010-16037.

The organic semiconductor material may be, for example, an aromatic compound, which has a π-electron conjugated system, a chain compound, an organic pigment, or an organic silicon compound. Specific examples thereof include pentacene derivatives such as pentacene, silylethyl-substituted pentacene, anthradithiophene derivatives, benzothienobenzothiophene derivatives, dinaphthothienothiophene derivatives, low molecular weight organic semiconductor materials such as thiophene, perylene, fullerene, and polypyrrole compounds such as polypyrrole, poly(N-substituted pyrrole), poly(3-substituted pyrrole) and poly(3,4-disubstituted pyrrole), polythiophene compounds such as polythiophene, poly(3-substituted thiophene), poly(3,4-disubstituted thiophene) and polybenzothiophene, polyisothianaphthene compounds such as polyisothianaphthene, polythienylene vinylene compounds such as polythienylene vinylene, poly(p-phenylenevinylene) compounds such as poly(p-phenylenevinylene), polyaniline compounds such as polyaniline and poly(N-substituted aniline), polyacetylene compounds such as polyacetylene and polydiacetylene, and polyazulene compounds such as polyazulene, and other high molecular weight organic semiconductor materials. Use may be made of a mixture in which of the organic semiconductor material is mixed with an organic polymer. Examples of the organic polymer to be mixed include polystyrene, polystyrene derivatives, polymethyl methacrylate resins, polyvinyl carbazoles, and polytriallylamines. The organic polymer may be an ordinary organic polymer other than the organic polymers referred to herein.

When a semiconductor layer is formed as the functional portion, the functional portion-formation coating and the method for forming the semiconductor layer are appropriately selected in accordance with the kinds of the semiconductor material. When the material is, for example, inorganic, the functional portion-formation coating may be a precursor of the inorganic semiconductor material. By coating the precursor and subsequently subjecting the precursor to heating treatment, an inorganic semiconductor layer can be formed. When the semiconductor material is organic, the functional portion-formation coating may be a solution in which the above-mentioned organic semiconductor material is dissolved in an organic solvent, or a solution in which the organic semiconductor material and the above-mentioned organic polymers, the ratio therebetween being any ratio, are incorporated into an organic solvent. By coating the solution and subsequently drying the organic solvent, an organic semiconductor layer can be formed.

(2) Pattern Formed Body

The pattern formed body used in the present method is a body manufactured by the above-mentioned manufacturing method of the pattern formed body.

About this pattern formed body and a manufacturing method of the pattern formed body, the same has been detailed in the item "A. Manufacturing method of pattern formed body". Thus, a description thereof is omitted herein.

When the functional portion or is an electrode or a wiring, the hydrophobic layer of the pattern formed body is preferably an insulation layer. When the semiconductor element is a transistor or diode, and the functional portion is a gate electrode, source/drain electrodes or a semiconductor layer, the hydrophobic layer of the pattern formed body is preferably a gate insulation film.

As described in the item "A. Manufacturing method of pattern formed body", when the hydrophobic layer is a gate insulation film, the gate insulation film is not particularly limited as far as the film has a surface having hydrophobicity. The film may be, for example, a single layer containing a hydrophobic material (hydrophobic layer of a first embodiment). The film may be a functional layer having a predetermined function and a layer exhibiting hydrophobicity is laminated onto each other (hydrophobic layer of a second embodiment). In other words, the gate insulation film may be a single layer containing a hydrophobic material exhibiting insulating properties, or a film in which a functional layer exhibiting insulating properties and a layer exhibiting hydrophobicity are laminated onto each other. The gate insulation film is preferably the latter film (film in which a functional layer exhibiting insulating properties and a layer exhibiting hydrophobicity are laminated onto each other) since the film is separated into the layers in accordance with individual functions of the film so that the film can easily be changed in the layer structure thereof, the combination of materials therefor, and others.

When the gate insulation film is a single layer containing a hydrophobic material exhibiting insulating properties, the hydrophobic material exhibiting insulating properties is not particularly limited as far as the material satisfies a desired voltage endurance and hydrophobicity. The hydrophobic material exhibiting insulating properties may be the same as described about the hydrophobic layer of the first embodiment in the item "A. Manufacturing method of pattern formed body"; thus, a description thereof is omitted herein.

The method for forming the gate insulation film may be, for example, a dry method such as CVD or PVD, or a wet method of coating a coating containing the hydrophobic material exhibiting insulating properties. The method of coating the coating may be, for example, spin coating, die coating, roll coating, bar coating, LB, dip coating, spray coating, blade coating, casting, ink-jetting, screen printing, pad printing, flexo printing, micro contact printing, gravure printing, offset printing, or gravure/offset printing.

The thickness of the gate insulation film may be set into the range of about 0.01 to 10 μm.

When the gate insulation film is a film in which a functional layer exhibiting insulating properties and a layer exhibiting hydrophobicity are laminated onto each other, the material of the functional layer is not particularly limited as far as the material is an insulative material satisfying a desired voltage endurance. The insulative material may be the same as used for an ordinary gate insulation film. Examples thereof include insulative inorganic materials such as silicon oxide, silicon nitride, aluminum oxide, tantalum oxide, barium strontium titanate (BST), and lead zirconate titanate (PZT); and insulative organic materials such as an acrylic resin, a phenolic resin, a fluorine-contained resin, an epoxy resin, a cardo resin, a vinyl resin, an imide resin, and a novolak resin.

The method for forming the functional layer may be, for example, a dry method such as CVD or PVD, or a wet method of coating a coating containing the insulative material. The method of coating the coating may be, for example, spin coating, die coating, roll coating, bar coating, LB, dip coating, spray coating, blade coating, casting, ink-jetting, screen printing, pad printing, flexo printing, micro contact printing, gravure printing, offset printing, or gravure/offset printing.

The thickness of the functional layer may be set into the range of about 0.01 to 10 μm.

The layer exhibiting hydrophobicity may be the same as described in connection with the hydrophobic layer of the second embodiment in the item "A. Manufacturing method of pattern formed body", thus, a description thereof is omitted herein.

In the invention, it is possible to manufacture any one of a bottom gate/bottom contact structure, a bottom gate/top contact structure, a top gate/bottom contact structure, and a top gate/top contact structure. When the hydrophobic layer is a gate insulation film and source/drain electrodes are formed as the functional portion, a bottom gate/bottom contact structure as has been illustrated in FIG. 5C can be manufactured. When the hydrophobic layer is an insulation film and a semiconductor layer is formed as the functional portion, a top gate/top contact structure as illustrated in FIG. 7E or a top gate/bottom contact structure (not illustrated) can be manufactured. When the hydrophobic layer is an insulation film and source/drain electrodes are formed as the functional portion, a top gate/bottom contact structure (not illustrated) can be manufactured. When the hydrophobic layer is a gate insulation film and a gate electrode is formed as the functional portion, a top gate/bottom contact structure or top gate/top contact structure (not illustrated) can be manufactured.

It is preferred that the hydrophobic layer is a gate insulation film and source/drain electrodes are formed as the functional portion for the following reason: as described above, in a bottom gate/bottom contact structure as illustrated in FIG. 5D, the state of the interface between the hydrophobic layer 2 (gate insulation film 22) and the semiconductor layer 25 can be made good so that characteristics of the element can be improved.

When the hydrophobic layer is a gate insulation film and source/drain electrodes or a semiconductor layer is formed as the functional portion, a gate electrode 21 is formed between the substrate 1 and the hydrophobic layer 2 (gate insulation film 22) as illustrated in FIGS. 4A to 4F and FIGS. 5A to 5C. The gate electrode may be equivalent to an ordinary gate electrode, and may be made of the same electroconductive material as used in the above-mentioned case of forming a gate electrode as the functional portion.

The method for making the electroconductive material into a film may be, for example, a CVD method such as plasma CVD, thermal CVD or laser CVD, a PVD method such as vacuum evaporation, sputtering or ion plating, an electroplating method, an immersion plating method, an electroless plating method, a sol-gel method, or a metal organic decomposition method (MOD). The method for patterning the film for the formation of the gate electrode may be usually photolithography.

The thickness of the gate electrode may be set into the range of about 30 to 500 nm.

When the hydrophobic layer is a gate insulation film and a gate electrode is formed as the functional portion, a semiconductor layer and source/drain electrodes are formed between the substrate and the hydrophobic layer (gate insulation film) (the situation is not illustrated).

The source electrode and the drain electrode may be equivalent to ordinary source and drain electrodes, respectively. The functional portion may be made of the same electroconductive material as used in the above-mentioned case of forming the source and the drain electrode as the functional portion.

The method for making the electroconductive material into a film is, for example, a CVD method such as plasma CVD, thermal CVD or laser CVD, a PVD method such as vacuum evaporation, sputtering or ion plating, an electroplating method, an immersion plating method, an electroless plating method, a sol-gel method, a metal organic decomposition method (MOD). The method may be a printing method such as screen printing, flexo printing, micro contact printing, inkjetting, offset printing, or gravure printing. The method for patterning the film for the formation of the source electrode and the drain electrode may be usually photolithography.

The thickness of each of the source electrode and the drain electrode may be set into the range of about 10 to 1000 nm.

The semiconductor layer may be equivalent to an ordinary semiconductor layer, and may be made of the same semiconductor material as used in the above-mentioned case of forming a semiconductor layer as the functional portion.

The method for forming the semiconductor layer and the thickness of the layer may be the same as those in semiconductor layer formation step, which will be detailed below.

2. Semiconductor Layer Formation Step

In a case where in the invention a gate electrode is formed between the substrate and the hydrophobic layer, the hydrophobic layer is a gate insulation film and the functional portions are each a source electrode and a drain electrode, it is preferred to conduct a semiconductor layer formation step of forming a semiconductor layer on the hydrophobic layer, after the functional portion formation step. In this case, a bottom gate/bottom contact structure as illustrated in FIG. 5C can be formed. In the invention, the state of the interface between the hydrophobic layer 2 (gate insulation film 22) and the semiconductor layer 25 can be made good so that a semiconductor element excellent in characteristics of the element can be manufactured.

The semiconductor material used for the semiconductor layer may be the same material as used for an ordinary semiconductor layer, and may be any one of an inorganic semiconductor material and an organic semiconductor material. The semiconductor layer may be made of the same semiconductor material as in the above-mentioned case of forming a semiconductor layer as the functional portion.

It is preferred that the semiconductor material is an organic semiconductor material. In other words, the semiconductor layer is preferably an organic semiconductor layer because of the following advantages: when the gate insulation film has hydrophobicity, the molecular orientation of the organic semiconductor material is improved so that the element-characteristic-improving effect becomes large; the organic semiconductor material can be made into a large area at lower costs, compared to inorganic materials; the organic semiconductor material can be made into a film on a flexible substrate; and further the organic semiconductor material is stable against mechanical impact.

The method for forming the semiconductor layer may be a dry method such as CVD or PVD, or a wet method of coating a semiconductor layer formation coating containing the semiconductor material.

The method of coating the semiconductor layer formation coating may be, for example, spin coating, die coating, roll coating, bar coating, LB, dip coating, spray coating, blade coating, or casting.

The thickness of the semiconductor layer is not particularly limited as far as the thickness allows a desired semiconductor characteristic to be obtained in accordance with the kinds of the semiconductor material, or the like. The thickness is preferably 1000 nm or less, more preferably from 5 to 300 nm, and even more preferably from 20 to 100 nm.

When the semiconductor layer is an organic semiconductor layer, it is sufficient that the semiconductor layer formation step is step of forming the organic semiconductor layer on the hydrophobic layer. The step has the following two preferred embodiments: a step of forming the organic semiconductor layer directly onto the hydrophobic layer with a surface having a contact angle of 100° or more onto pure water at 25° C. (semiconductor layer formation step of a first embodiment); and a step of radiating an energy onto the surface of the hydrophobic layer on which the functional portion are formed to make the surface hydrophilic, thereby forming the second hydrophilic area, modifying the surface of the second hydrophilic area with an organic compound to form surface-modified area, and then forming the target organic semiconductor layer over the surface-modified area (semiconductor layer formation step of a second embodiment). Hereinafter, the embodiments are described independently of each other.

(1) Semiconductor Layer Formation Step of First Embodiment

Semiconductor layer formation step of the embodiment is step, as illustrated in FIG. 5C, of forming the semiconductor layer 25 (organic semiconductor layer) directly onto the hydrophobic layer 2 with a surface having a contact angle of 100° or more onto pure water at 25° C.

When the hydrophobicity of the hydrophobic layer surface is high as descried just above, the orientation of the organic semiconductor material can be improved.

About the hydrophobic layer, the same has been detailed in the item "A. Manufacturing method of pattern formed body", thus, a description thereof is omitted herein.

In the embodiment, the orientation of the organic semiconductor material can be improved since the hydrophobicity of the hydrophobic layer surface is high as described above; therefore, a high molecular weight organic semiconductor material is preferably used as the organic semiconductor material.

The high molecular weight organic semiconductor material is the same as described about the above-mentioned functional portion formation step, thus, a description thereof is omitted herein.

The method for forming the organic semiconductor layer, the thickness of the layer or the like is equivalent to the above-mentioned semiconductor layer forming method, thickness, or the like.

(2) Semiconductor Layer Formation Step of Second Embodiment

Semiconductor layer formation step of the embodiment comprises: a second hydrophilicity imparting step of radiating an energy onto the surface of the hydrophobic layer on which the functional portion is formed to make the surface hydrophilic, thereby forming a second hydrophilic area; a surface modifying step of modifying the surface of the second hydrophilic area with an organic compound to form a surface-modified area; and an organic semiconductor layer formation step of forming an organic semiconductor layer on the surface-modified area.

FIGS. 8A to 8F are process charts illustrating an example of a manufacturing method of the semiconductor element having semiconductor layer formation step of the embodiment. First, a functional portion-formation coating is coated onto hydrophilic area 5a of a pattern formed body 10 illustrated in FIG. 8A to form a source electrode 23 and a drain electrode 24 (FIG. 8B) [functional portion formation step]. Next, vacuum-ultraviolet ray 15 is radiated through a metal mask 14 onto the hydrophobic layer 2 surface on which the source electrodes 23 and the drain electrode 24 are formed to make the surface hydrophilic (FIG. 8C), thereby forming second hydrophilic area 5c (FIG. 8D) [second hydrophilicity imparting step]. Next, the surface of the second hydrophilic area 5c is modified with an organic compound to form surface-modified area 5d (FIG. 8E) [surface modifying step]. Subsequently, a semiconductor layer 25 (organic semiconductor layer) is formed on the surface-modified area 5d (FIG. 8F) [organic semiconductor layer formation step]. In this way, a semiconductor element 20 is obtained. This semiconductor element is composed of a transistor or a diode each having a bottom gate/bottom contact structure.

When the hydrophobic layer contains a material which is partially decomposed by irradiation with an energy so as to generate OH groups, the radiation of the energy onto the hydrophobic layer surface causes the generation of OH groups in the hydrophobic layer surface so that the surface is made hydrophilic. When an organic semiconductor layer is formed on the hydrophobic layer which has the surface in which a polar group such as the OH group is formed, the semiconductor characteristics may deteriorate. However, the OH group can be selectively modified with the organic compound. Accordingly, by conducting the second hydrophilicity imparting step and the surface modifying step after the functional portion formation step, the areas where the organic semiconductor layer is formed can be made into a surface state that does not provide any bad effect onto the semiconductor characteristics. When the organic compound is, for example, an aromatic compound, the aromatic compound has a high affinity with an organic solvent while the compound has a high hydrophobicity to prevent the adsorption of water molecules onto the surface-modified area surface. It is therefore possible to improve the electroconductivity and reliability of the organic semiconductor layer formed on the surface-modified area. Moreover, by conducting the second hydrophilicity imparting step and the surface modifying step after the functional portion formation step, the wettability (hydrophobicity or hydrophilicity) of the area where the organic semiconductor layer is formed can be adjusted. Thus, when the organic semiconductor layer is formed by coating an organic semiconductor layer formation coating therefor, the coatability of this coating can be improved. When the organic compound is, for example, an aliphatic compound, the adjustment of the alkyl chain length of the aliphatic compound makes it possible to control the wettability (hydrophobicity or hydrophilicity) of the area where the organic semiconductor layer is formed.

Hereinafter, a description is made about each of the steps in the semiconductor layer formation step of the embodiment.

(a) Second Hydrophilicity Imparting Step

Second hydrophilicity imparting step in the embodiment is step of radiating an energy onto the surface of the hydrophobic layer on which the functional portion is formed to make the surface hydrophilic, thereby forming the second hydrophilic area.

The energy radiated onto the surface of the hydrophobic layer is not particularly limited as far as the energy makes it possible to make the surface of the hydrophobic layer hydrophilic. Examples thereof include ultraviolet rays, and an electron beam. The energy is in particular preferably vacuum-ultraviolet ray since the ray is high in energy intensity to make it possible to generate an oxygen active species more effectively, so that it makes the hydrophobic layer surface hydrophilic efficiently in a short period.

About the wavelengths, the light sources or the like of the vacuum-ultraviolet ray, the same has been described in connection with the hydrophilicity imparting step in the item "A. Manufacturing method of pattern formed body", thus, a description thereof is omitted herein.

The method for radiating an energy onto the hydrophobic layer surface on which the functional portion is formed is not particularly limited as far as the method makes it possible to make the area where the organic semiconductor layer is formed hydrophilic. The method is, for example, a method of radiating the energy thereonto through a mask such as a photomask or a metal mask, or a method of radiating the energy into a pattern form directly thereonto. The second hydrophilic area may be formed by conducting the same photoresist pattern formation step, hydrophilicity imparting step, and photoresist pattern peeling step as in the item "A. Manufacturing method of pattern formed body".

The hydrophilicity of the second hydrophilic area may be equivalent to that of the hydrophilic area described in the item "A. Manufacturing method of pattern formed body", thus, a description thereof is omitted herein.

(b) Surface Modifying Step

Surface modifying step in the embodiment is a step of modifying the surface of the second hydrophilic area with an organic compound to form surface-modified area.

The organic compound, with which the second hydrophilic area surface is modified, is not particularly limited as far as the compound makes it possible to make the second hydrophilic area surface into a desired wettability (hydrophobicity or hydrophilicity). The compound is preferably an organic compound capable of forming a self-organized monomolecular film since surface-modified area made of the self-organized monomolecular film can easily be formed on the second hydrophilic area.

The organic compound capable of forming a self-organized monomolecular film is not particularly limited as far as the compound makes it possible to make the second hydrophilic area surface into a desired wettability (hydrophobicity or hydrophilicity). Examples thereof include aromatic compounds such as phenethyltrichlorosilane, phenyltrichlorosilane, phenyltrimethoxysilane, phenyltriethoxysilane, phenethyltrimethoxysilane, and phenethyltriethoxysilane; and aliphatic compounds such as hexamethyldisilazane, octyltrichlorosilane, octadecyltrichlorosilane, fluorinated alkylsilanes, alkyltrimethoxysilanes, and alkyltriethoxysilanes.

The organic compound capable of forming a self-organized monomolecular film is preferably an aromatic compound in the case of improving the coatability of the organic-semiconductor-material-containing organic semiconductor layer formation coating for the following reason: as described above, the self-organized monomolecular film of the aromatic compound has a high affinity with an organic solvent while the film is high in hydrophobicity so that the adsorption of water molecules onto the surface-modified area surface can be prevented; thus, it is possible to improve the electroconductivity and the reliability of the organic semiconductor layer formed on the surface-modified area.

The method for modifying the second hydrophilic area surface with the organic compound is, for example, an immersion adsorbing method of immersing the second hydrophilic area into a solution containing the organic compound to cause the organic compound to be adsorbed on the area, or a gas phase adsorbing method of vaporizing the organic compound to cause the compound to be adsorbed onto the second hydrophilic area.

(c) Organic Semiconductor Layer Formation Step

Organic semiconductor layer formation step in the embodiment is a step of forming an organic semiconductor layer on the surface-modified area.

The method for forming the organic semiconductor layer may be a dry method such as CVD or PVD, or a wet method of coating an organic semiconductor layer formation coating containing an organic semiconductor material. Preferred is the wet method, for which a large equipment investment for an evacuation system or the like is not required. As described above, by conducting the second hydrophilicity imparting step and the surface modifying step, the coatability of the organic semiconductor layer formation coating can be improved.

The method for coating the organic semiconductor layer formation coating may be equivalent to the above-mentioned method for coating the semiconductor layer formation coating.

The thickness of the organic semiconductor layer may also be equivalent to the above-mentioned thickness of the semiconductor layer.

3. Semiconductor Element

The semiconductor element manufactured by the manufacturing method of the semiconductor element of the invention is preferably a transistor or a diode, more preferably a transistor, and in particular preferably an organic transistor for the following reason: as described above, in the case of an organic transistor having a bottom gate/bottom contact structure as illustrated in FIG. 5C, the organic transistor excellent in transistor characteristics, such as on-off current ratio, threshold voltage $V_{th}$, and mobility, can be manufactured.

When the semiconductor element is a transistor or a diode, the element may be an element having any one of a bottom gate/bottom contact structure, a bottom gate/top contact structure, a top gate/bottom contact structure, and a top gate/top contact structure. The element is preferably an element having a bottom gate/bottom contact structure since the semiconductor characteristics can be improved as explained above.

The semiconductor element manufactured by the manufacturing method of the semiconductor element of the invention may be used for, for example, a liquid crystal display device, an electrophoretic display device, or an organic EL display device.

The invention is not limited to the above-mentioned embodiments. The embodiments are mere examples, and any embodiment that has substantially the same structure of the technical conception recited in the claims of the invention, and that provides the similar advantageous effects is included in the technical scope of the invention.

EXAMPLES

Hereinafter, the invention is described in more detail by way of the following examples.

Example 1

A Cr thin film (film thickness: 150 nm) was formed on a glass substrate by sputtering deposition. Next, through a photolithographic step and an etching step, the Cr thin film was patterned to form gate electrodes. Next, an acrylic resin was formed on the gate electrodes by spin coating, and the resin was cured through an ultraviolet ray radiating step and a heating step to form an insulation film (film thickness: 1 μm). Next, prepared was a dispersion liquid A of an organosiloxane polymer having alkyl groups, and the dispersion A was coated onto the insulation film by spin coating to form a layer exhibiting hydrophobicity (film thickness: 50 nm). Pure water of 25° C. temperature was dropped out in a volume of 1.2 μL onto the surface of the formed layer exhibiting hydrophobicity, and the contact angle thereof was measured by the θ/2θ method. As a result, the contact angle was 102°.

A fluorine-based surfactant having perfluoroalkyl groups was added to a positive photoresist to give a solid content by percentage of 0.5% by weight. In this way, a photoresist was prepared. Next, the photoresist was coated onto the layer exhibiting hydrophobicity by spin coating, and then the workpiece was caused to undergo a light exposure step using a photomask and a developing step to remove the photoresist on source- and drain-electrode forming areas of the workpiece.

Next, in the atmosphere, vacuum-ultraviolet rays (wavelength: 172 nm, and illuminance: 3 mW/cm$^2$) were radiated onto the workpiece for 60 seconds to make the source- and drain-electrode forming areas hydrophilic. Pure water of 25° C. temperature was dropped out in a volume of 1.2 μL onto the areas made hydrophilic, and the contact angle thereof was measured by the θ/2θ method. As a result, the contact angle was 5° or less.

Next, the workpiece was immersed in acetone to remove the photoresist, and next rinsed/washed with isopropyl alcohol (IPA) to form a hydrophilic/hydrophobic pattern substrate. Pure water of 25° C. temperature was dropped out in a volume of 1.2 μL onto the area which had been covered with the photoresist at the time of the vacuum-ultraviolet ray radiation, and the contact angle thereof was measured by the θ/2θ method. As a result, the contact angle was 102°, which was equal to that before the coating of the photoresist.

Next, a silver colloid liquid, which was dispersed in water (solid concentration: 20% by weight), was coated onto the entire surface of the hydrophilic/hydrophobic pattern substrate by bar coating (bar gap: 1.5 mil, and coating speed: 20 mm/s) to cause the silver colloid liquid to adhere selectively only onto the hydrophilic areas, thereby attaining patterning. Thereafter, the workpiece was caused to undergo a heating/drying step in an oven of 150° C. temperature for 30 minutes to sinter the silver colloid, thereby forming source/drain electrodes (film thickness: 200 nm). The formed electrodes were observed with a microscope. As a result, the source/drain electrodes, which had a channel width of 1200 μm and a channel length of 50 μm, were formed as designed through the photomask used at the time of the light exposure. This appears to be based on the following: the areas other than the source/drain-electrode forming areas were covered with the photoresist at the time of the vacuum-ultraviolet ray radiation so as to be protected from any oxygen active species generated at this radiation time, so that the hydrophilic/hydrophobic pattern was formed as designed through the photomask.

Next, prepared was an organic semiconductor layer formation coating in which a thiophene based polymer was dissolved in a solution of monochlorobenzene to give a solid concentration of 1% by weight, and the solution was coated onto the source/drain-electrode-formed surface by spin coating to form an organic semiconductor layer having a film thickness of 50 nm. In this way, a transistor element was manufactured.

The current-voltage characteristic of the manufactured transistor element was measured while the source/drain voltage was set to −80 V and the gate voltage was changed from 50 to −80 V. As a result, the transistor mobility was estimated to be $8.5 \times 10^{-2}$ $cm^2/Vs$. The measurement of the current-voltage characteristic was made in a vacuum in the state that any light was shielded.

Moreover, a bias stress test was made in which a voltage of −50V was applied to each of the source/drain voltage and the gate voltage for 1000 seconds and a change in the source/drain current was observed. As a result, 99.8% of the initial source/drain current was kept after the 1000 seconds. Thus, the element exhibited a good bias stress resistance. This appears to be based on the following: at the time of the above-mentioned vacuum-ultraviolet ray radiation, the area between the organic-semiconductor-layer-laminated source and drain electrodes of each of the transistors was covered with the photoresist so as to be protected from any oxygen active species generated at this radiation time, so that it did not happen that the surface of the layer exhibiting hydrophobicity was made hydrophilic by the formation of OH groups providing a bad effect on the bias stress.

Example 2

Gate electrodes and an insulation film on the gate electrodes were formed in the same way as in Example 1. Next, prepared was a dispersion liquid B of an organosiloxane polymer having alkyl groups, the dispersion B being prepared under conditions different from those in Example 1, and the dispersion B was coated onto the insulation film by spin coating to form a layer exhibiting hydrophobicity (film thickness: 50 nm). Pure water of 25° C. temperature was dropped out in a volume of 1.2 μL onto the surface of the formed layer exhibiting hydrophobicity, and the contact angle thereof was measured by the θ/2θ method. As a result, the contact angle was 95°.

Next, source/drain electrodes were formed in the same way as in Example 1. At this time, pure water of 25° C. temperature was dropped out in a volume of 1.2 μL onto the areas made hydrophilic, and the contact angle thereof was measured by the θ/2θ method. As a result, the contact angle was 5° or less. Moreover, pure water of 25° C. temperature was dropped out in a volume of 1.2 μL onto the areas which had been covered with the photoresist at the time of the vacuum-ultraviolet ray radiation, and the contact angle thereof was measured by the θ/2θ method. As a result, the contact angle was 95°, which was equal to that before the coating of the photoresist. The formed electrodes were observed with a microscope. As a result, the source/drain electrodes, which had a channel width of 1200 μm and a channel length of 50 μm, were formed as designed through the photomask used at the time of the light exposure.

Next, an organic semiconductor layer was formed in the same way as in Example 1 to manufacture a transistor element.

The current-voltage characteristic of the manufactured transistor element was measured while the source/drain voltage was set to −80 V and the gate voltage was changed from 50 to −80 V. As a result, the transistor mobility was estimated to be $5.7 \times 10^{-2}$ $cm^2/Vs$. The measurement of the current-voltage characteristic was made in a vacuum in the state that any light was shielded.

Example 3

In the same way as in Example 1, steps up to the formation of source/drain electrodes were carried out to prepare an element.

Next, a metal mask was caused to adhere onto the element, and vacuum-ultraviolet rays (wavelength: 172 nm, and illuminance: 3 $mW/cm^2$) were radiated through openings in the metal mask onto the surface of the layer exhibiting hydrophobicity of the element and between the source and drain electrodes in the atmosphere for 60 seconds to make the surface of the layer exhibiting hydrophobicity hydrophilic. Pure water of 25° C. temperature was dropped out in a volume of 1.2 μL onto the surface made hydrophilic, and the contact angle thereof was measured by the θ/2θ method. As a result, the contact angle was 5° or less.

Next, the surface made hydrophilic was exposed to vapor of HMDS (hexamethyldisilazane) for 1 hour to cause molecules of HMDS to adsorb onto the surface. Pure water of 25° C. temperature was dropped out in a volume of 1.2 μL onto the surface on which HMDS molecules were caused to adsorb, and the contact angle thereof was measured by the θ/2θ method. As a result, the contact angle was 91°. It appears that OH groups were formed in the surface by the hydrophilicity imparting treatment conducted by the vacuum-ultraviolet rays radiation and the HMDS molecules were caused to adhere onto the OH groups by the subsequently conducted HMDS treatment so that the contact angle was changed.

Next, an organic semiconductor layer was formed in the same way as in Example 1 to manufacture a transistor element.

The current-voltage characteristic of the manufactured transistor element was measured while the source/drain voltage was set to −80 V and the gate voltage was changed from 50 to −80 V. As a result, the transistor mobility was estimated to be $8.8 \times 10^{-2}$ $cm^2/Vs$. The measurement of the current-voltage characteristic was made in a vacuum in the state that any light was shielded.

Comparative Example 1

Gate electrodes, an insulation layer on the gate electrodes, and a layer exhibiting hydrophobicity were formed in the same way as in Example 1.

Next, a metal mask having openings corresponding to source/drain electrode forming areas of the workpiece was caused to adhere onto the layer exhibiting hydrophobicity. The adhesion was attained by arranging a magneto onto the rear surface of the glass substrate, and attracting the metal mask by magnetic force. Next, in the atmosphere, vacuum-ultraviolet rays (wavelength: 172 nm, and illuminance: 3 $mW/cm^2$) were radiated onto the workpiece for 60 seconds to make the source/drain electrode forming areas hydrophilic. Pure water of 25° C. temperature was dropped out in a volume of 1.2 μL onto the areas made hydrophilic, and the contact angle thereof was measured by the θ/2θ method. As a result, the contact angle was 5° or less.

Next, a silver colloid liquid was coated by bar coating onto the entire surface in the same way as in Example 1 under the same conditions as therein, so as to make an attempt of the formation of source/drain electrodes.

Then, the formed electrodes were observed with a microscope. As a result, the source/drain electrodes, which had a channel width of 1200 μm and a channel length of 50 μm, were not patterned, and the source and drain electrodes were electrically connected to each other through the coated silver colloid. Thus, when the metal mask was used to make the layer exhibiting hydrophobicity hydrophilic and further pattern this layer, a transistor element was unable to be manufactured. This appears to be because any oxygen active species generated at the time of the vacuum-ultraviolet ray radiation went around from a gap between the irregularities of the metal mask surface and the layer exhibiting hydrophobicity to non-opening areas of the metal mask so that the surface of the layer exhibiting hydrophobicity around the source/drain forming areas was made hydrophilic by the formation of OH groups in the surface.

Comparative Example 2

Gate electrodes, an insulation layer on the gate electrodes, and a layer exhibiting hydrophobicity were formed in the same way as in Example 1.

Next, a photomask having light-non-shielding areas corresponding to source/drain electrode forming areas of the workpiece was arranged on the layer exhibiting hydrophobicity to have a gap of 50 μm therebetween. Next, in the atmosphere, vacuum-ultraviolet rays (wavelength: 172 nm, and illuminance: 3 mW/cm$^2$) were radiated onto the workpiece for 60 seconds to make the source/drain electrode forming areas hydrophilic. Pure water of 25° C. temperature was dropped out in a volume of 1.2 μL onto the areas made hydrophilic, and the contact angle thereof was measured by the θ/2θ method. As a result, the contact angle was 5° or less.

Next, a silver colloid liquid was coated onto the entire surface by bar coating in the same way as in Example 1 under the same conditions as therein, so as to make an attempt of the formation of source/drain electrodes.

In the same way as in Comparative Example 1, the formed electrodes were observed with a microscope. As a result, the source/drain electrodes, which had a channel width of 1200 μm and a channel length of 50 μm, were not patterned, and the source and drain electrodes were electrically connected to each other through the coated silver colloid. Thus, when the photomask was used to make the layer exhibiting hydrophobicity hydrophilic and further pattern this layer, a transistor element was unable to be manufactured. This appears to be because any oxygen active species generated at the time of the vacuum-ultraviolet ray radiation went around from a gap between the photomask and the layer exhibiting hydrophobicity to light-shielding areas of the photomask so that the surface of the layer exhibiting hydrophobicity around the source/drain forming areas was made hydrophilic by the formation of OH groups in the surface.

What is claimed is:

1. A manufacturing method of a semiconductor element comprising:
    a functional portion formation step of coating a functional portion formation-coating on a hydrophilic area of a pattern formed body manufactured by method for manufacturing a pattern formed body, comprising:
    a photoresist pattern formation step of forming a photoresist on a hydrophobic layer formed on a substrate and having a surface exhibiting hydrophobicity;
    a hydrophilicity imparting step of radiating an energy into the surface of the hydrophobic layer on which the photoresist pattern is formed, thereby making the surface hydrophilic to form a hydrophilic area; and
    a photoresist pattern peeling step of peeling the photoresist pattern and forming a hydrophilic/hydrophobic pattern on the hydrophobic layer surface, in which the hydrophilic area and a hydrophobic area covered previously with the photoresist pattern in the hydrophilicity imparting step are formed in a pattern form, thereby forming a functional portion,
    wherein a gate electrode is formed between the substrate and the hydrophobic layer, the hydrophobic layer is a gate insulation layer, and the functional portion is a source electrode and a drain electrode, and wherein the method further comprising, after the functional portion formation step, a semiconductor layer formation step of forming a semiconductor layer on the hydrophobic layer.

2. The manufacturing method of the semiconductor element according to claim 1, wherein the semiconductor layer is an organic semiconductor layer.

3. The manufacturing method of the semiconductor element according to claim 2, wherein the hydrophobic layer surface has a contact angle of 100° or more onto pure water at 25° C., and in the semiconductor layer formation step, the organic semiconductor layer is formed directly on the hydrophobic layer.

4. The manufacturing method of the semiconductor element according to claim 2, wherein semiconductor layer formation step comprises:
    a second hydrophilicity imparting step of radiating an energy onto the surface of the hydrophobic layer where the functional portion is formed, thereby making the surface hydrophilic to form a second hydrophilic area;
    a surface modifying step of modifying a surface of the second hydrophilic area with an organic compound, thereby forming a surface-modified area; and
    an organic semiconductor layer formation step of forming the organic semiconductor layer on the surface-modified area.

* * * * *